United States Patent
Hata et al.

(10) Patent No.: US 8,835,906 B2
(45) Date of Patent: Sep. 16, 2014

(54) SENSOR, SEMICONDUCTOR WAFER, AND METHOD OF PRODUCING SEMICONDUCTOR WAFER

(75) Inventors: Masahiko Hata, Ibaraki (JP); Tomoyuki Takada, Ibaraki (JP); Sadanori Yamanaka, Chiba (JP); Taro Itatani, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 155 days.

(21) Appl. No.: 13/310,522

(22) Filed: Dec. 2, 2011

(65) Prior Publication Data
US 2012/0138898 A1    Jun. 7, 2012

Related U.S. Application Data

(63) Continuation-in-part of application No. PCT/JP2010/003723, filed on Jun. 3, 2010.

(30) Foreign Application Priority Data

Jun. 5, 2009 (JP) .................................. 2009-136666

(51) Int. Cl.
*H01L 31/0352* (2006.01)
*H01L 31/18* (2006.01)
(Continued)

(52) U.S. Cl.
CPC ........ *H01L 27/1446* (2013.01); *H01L 31/1852* (2013.01); *Y02E 10/52* (2013.01); *H01L 31/1035* (2013.01); *G01J 5/024* (2013.01); *Y02E 10/544* (2013.01); *H01L 31/0522* (2013.01); *H01L 31/0392* (2013.01)
USPC ............. 257/21; 257/184; 257/185; 257/190; 257/200; 257/E27.127; 257/E27.129; 438/94

(58) Field of Classification Search
USPC ........... 257/21, 184, 428, 431, 432, 443, 444, 257/461, E31.032, 185, 190, 200, 257/E27.122–E27.125, E27.127, E27.129; 438/57, 93, 94
See application file for complete search history.

(56) References Cited

U.S. PATENT DOCUMENTS

| | | | |
|---|---|---|---|
| 4,614,564 A | 9/1986 | Sheldon et al. | |
| 4,639,756 A | 1/1987 | Rosbeck et al. | |

(Continued)

FOREIGN PATENT DOCUMENTS

| | | |
|---|---|---|
| JP | 60-210831 A | 10/1985 |
| JP | 61-094318 A | 5/1986 |

(Continued)

OTHER PUBLICATIONS

Translation of International Preliminary Report on Patentability and Written Opinion issued Jan. 26, 2012 in International Patent Application No. PCT/JP2010/003723.

(Continued)

*Primary Examiner* — Ermias Woldegeorgis
(74) *Attorney, Agent, or Firm* — Sughrue Mion, PLLC

(57) ABSTRACT

A sensor includes: a base wafer containing silicon; a seed member provided directly or indirectly on the base wafer; and a photothermal absorber that is made of a Group 3-5 compound semiconductor lattice-matching or pseudo lattice-matching the seed member and being capable of generating a carrier upon absorbing light or heat, where the photothermal absorber outputs an electric signal in response to incident light to be introduced into the photothermal absorber or heat to be applied to the photothermal absorber. A semiconductor wafer includes: a base wafer containing silicon; a seed member provided directly or indirectly on the base wafer; and a photothermal absorber that is made of a Group 3-5 compound semiconductor lattice-matching or pseudo lattice-matching the seed member and being capable of generating a carrier upon absorbing light or heat.

20 Claims, 19 Drawing Sheets

(51) Int. Cl.
*H01L 31/103* (2006.01)
*H01L 27/144* (2006.01)
*H01L 31/052* (2014.01)
*H01L 31/0392* (2006.01)
*G01J 5/02* (2006.01)

(56) References Cited

U.S. PATENT DOCUMENTS

| | | | |
|---|---|---|---|
| 4,925,810 A | 5/1990 | Kano et al. | |
| 2004/0121507 A1* | 6/2004 | Bude et al. | 438/93 |
| 2006/0042677 A1 | 3/2006 | Fukunaga et al. | |
| 2007/0057144 A1* | 3/2007 | Asano | 250/200 |
| 2008/0070355 A1 | 3/2008 | Lochtefeld et al. | |
| 2010/0308376 A1 | 12/2010 | Takada et al. | |
| 2011/0006343 A1 | 1/2011 | Hata et al. | |
| 2011/0006368 A1 | 1/2011 | Hata et al. | |
| 2011/0006399 A1 | 1/2011 | Takada et al. | |
| 2011/0012175 A1 | 1/2011 | Takada et al. | |
| 2011/0018030 A1 | 1/2011 | Takada et al. | |
| 2011/0037099 A1 | 2/2011 | Takada et al. | |
| 2011/0180903 A1 | 7/2011 | Hata | |
| 2011/0180949 A1 | 7/2011 | Bierdel et al. | |
| 2011/0186911 A1 | 8/2011 | Hata | |
| 2011/0266595 A1 | 11/2011 | Hata | |

FOREIGN PATENT DOCUMENTS

| | | | |
|---|---|---|---|
| JP | 61-135115 A | | 6/1986 |
| JP | 61-188927 A | | 8/1986 |
| JP | 61-294877 | | 12/1986 |
| JP | 62-230066 A | | 10/1987 |
| JP | 63-7672 A | | 1/1988 |
| JP | 63-108709 A | | 5/1988 |
| JP | 63-503266 A | | 11/1988 |
| JP | 1-149444 A | | 6/1989 |
| JP | 03210433 A | * | 9/1991 |
| JP | 5-29643 A | | 2/1993 |
| JP | 6-326029 A | | 11/1994 |
| JP | 6-334168 A | | 12/1994 |
| JP | 7-321357 A | | 12/1995 |
| JP | 10-511815 A | | 11/1998 |
| JP | 2000-332229 A | | 11/2000 |
| JP | 2000332229 A | * | 11/2000 |
| JP | 2006-66456 A | | 3/2006 |
| JP | 2006-513584 A | | 4/2006 |
| JP | 2007-81185 A | | 3/2007 |
| JP | 2007-281266 A | | 10/2007 |
| WO | 97/04493 A1 | | 2/1997 |

OTHER PUBLICATIONS

Japanese Office Action issued on Feb. 25, 2014 in Japanese Patent Application No. 2010-128368 with English translation.
Office Action issued Jul. 22, 2014 in Japanese Patent Application No. 2010-128368.

* cited by examiner

SENSOR, SEMICONDUCTOR WAFER, AND METHOD OF PRODUCING SEMICONDUCTOR WAFER

The contents of the following Japanese patent application and PCT patent application are incorporated herein by reference:
  JP2009-136666 filed on Jun. 5, 2009, and
  PCT/JP2010/003723 filed on Jun. 3, 2010.

TECHNICAL FIELD

The present invention relates to a sensor, a semiconductor wafer, and a method of producing a semiconductor wafer.

BACKGROUND ART

Patent Document 1 discloses a solid-state image sensor in which a photoelectric conversion section is provided directly or indirectly on the signal transfer circuitry wafer (silicon wafer) in which the signal transfer circuit has been formed. For example, the photoelectric conversion section is constituted by stacking a first photoelectric conversion layer made of InAlP having a band gap in 440 to 480 nm, a second photoelectric conversion layer made of InGaAlP having a band gap in 520 to 580 nm, and a third photoelectric conversion layer made of GaAs having a band gap in longer wavelength than 600 nm.
Patent Document 1: JP2006-66456 A

SUMMARY OF THE INVENTION

Problems to be Solved by the Invention

Direct gap compound semiconductors have high quantum efficiency in optical absorption, and so are suited as a sensor material. However, when epitaxially growing such a direct gap compound semiconductor on a silicon wafer, defects penetrating the crystal layer may occasionally be caused attributed to the difference in lattice constant between the silicon wafer and the epitaxially grown layer. When there is such a defect penetrating the compound semiconductor that is used in forming a sensor, the performance of the sensor will be degraded, which is undesirable.

Means for Solving the Problems

For a solution to the above-mentioned problems, according to the first aspect related to the present invention, provided is a sensor including: a base wafer containing silicon; a seed member provided directly or indirectly on the base wafer; and a photothermal absorber that is made of a Group 3-5 compound semiconductor lattice-matching or pseudo lattice-matching the seed member and being capable of generating a carrier upon absorbing light or heat, where the photothermal absorber outputs an electric signal in response to incident light to be introduced into the photothermal absorber or heat to be applied to the photothermal absorber.

According to the second aspect related to the present invention, provided is a semiconductor wafer including; a base wafer containing silicon; a seed member provided directly or indirectly on the base wafer: and a photothermal absorber that is made of a Group 3-5 compound semiconductor lattice-matching or pseudo lattice-matching the seed member and being capable of generating a carrier upon absorbing light or heat.

In addition, the aforementioned sensor or the aforementioned semiconductor wafer may further include an inhibitor that is formed directly or indirectly on the base wafer, has an aperture in which at least a partial region of the base wafer is exposed, and inhibits crystal growth, where the seed member is formed in the aperture. The inhibitor may include a plurality of the apertures, and the sensor may comprise a plurality of the photothermal absorbers formed inside the plurality of the apertures.

In the aforementioned sensor or the aforementioned semiconductor wafer, the photothermal absorber includes $Ga_{x1}In_{1-x1}N_{y1}P_{z1}As_{w1}Sb_{1-y1-z1-w1}$ ($0 \leq x1 \leq 1$, $0 \leq y1 \leq 1$, $0 \leq z1 \leq 1$, $0 \leq w1 \leq 1$, and $0 \leq y1+z1+w1 \leq 1$), and the seed member is made of $C_{x2}Si_{y2}Ge_{z2}Sn_{1-x2-y2-z2}$ ($0 \leq x2 \leq 1$, $0 \leq y2 \leq 1$, $0 \leq z2 \leq 1$, and $0 < x2+y2+z2 \leq 1$) or $Ga_{x3}In_{1-x3}N_{y3}P_{z3}As_{w2}Sb_{1-y3-z3-w2}$ ($0 \leq x3 \leq 1$, $0 \leq y3 \leq 1$, $0 \leq z3 \leq 1$, $0 \leq w2 \leq 1$, and $0 \leq y3+z3+w2 \leq 1$). The photothermal absorber may be a superlattice structure in which a first layer and a second layer are stacked together, where the first layer is made of $Ga_{x1}In_{1-x1}N_{y1}P_{z1}As_{w1}Sb_{1-y1-z1-w1}$ ($0 \leq x1 \leq 1$, $0 \leq y1 \leq 1$, $0 \leq z1 \leq 1$, $0 \leq w1 \leq 1$, and $0 \leq y1+z1+w1 \leq 1$) and the second layer is made of $Ga_{x4}In_{1-x4}N_{y4}P_{z4}As_{w3}Sb_{1-y4-z4-w3}$ ($0 \leq x4 \leq 1$, $0 \leq y4 \leq 1$, $0 \leq z4 \leq 1$, $0 \leq w3 \leq 1$, and $0 \leq y4+z4+w3 \leq 1$) and has a band gap larger than the band gap of the first layer.

The seed member may be made of $C_{x2}Si_{y2}Ge_{z2}Sn_{1-x2-y2-z2}$ ($0 \leq x2 \leq 1$, $0 \leq x2 \leq 1$, $0 \leq z2 \leq 1$, and $0 \leq x2+y2+z2 \leq 1$), and the sensor further comprises an interface region formed inside the base wafer in contact with an interface between the base wafer and the seed member, the interface region having a composition $C_{x2}Si_{y2'}Ge_{z2}Sn_{1-x2-y2-z2}$ ($0 \leq x2 \leq 1$, $0 \leq y2' \leq 1$, $0 \leq z2 \leq 1$, $0 < x2+y2+z2 \leq 1$, and $y2 < y2' < 1$).

In an example, the aforementioned sensor or the aforementioned semiconductor wafer may further include a recombination repressor that is formed in contact with a side wall of the photo thermal absorber and represses recombination of a carrier generated by the Group 3-5 compound semiconductor on the side wall, the recombination repressor having a semiconductor or a dielectric having a larger band gap than the band gap of the photothermal absorber. The photothermal absorber may have a compositional distribution such that the band gap is larger at a position further distanced from the center of the plane parallel to the base wafer. The photothermal absorber may have a compositional distribution such that the ratio of In is smaller at a position further distanced from the center when x1 is not 1.

In the aforementioned sensor or the aforementioned semiconductor wafer, the base wafer may include an impurity region containing an impurity having a conductivity type opposite to the conductivity type of an impurity contained in a bulk region of the silicon, and the photothermal absorber may be electrically coupled to the impurity region via the seed member. Such a configuration is also possible in which the base wafer includes an impurity region containing an impurity, the seed member is disposed in contact with the impurity region, and at least two of the plurality of the photothermal absorbers are electrically coupled to the impurity region via the seed member.

Moreover, the aforementioned sensor may further include a light collecting section that collects at least part of the incident light and introduces it to the photothermal absorber. The light collecting section is disposed on a side of the base wafer opposite to the side on which the photothermal absorber is disposed, and collects the incident light and introduces it to the photothermal absorber via the base wafer. The aforementioned sensor may further include an optical filter arranged on a path along which the incident light is introduced to the photothermal absorber.

The aforementioned sensor may include: an inhibitor that is formed directly or indirectly on the base wafer, has a plurality of apertures in which at least a partial region of the base wafer is exposed, and inhibits crystal growth, a plurality of seed members provided in the plurality of the apertures; and a plurality of photothermal absorbers, each disposed on a corresponding one of the plurality of the seed members and lattice-matching or pseudo lattice-matching the corresponding seed member, where the light collecting section introduces at least part of the incident light on each of the plurality of the photothermal absorbers.

In an example, the aforementioned sensor may further include a plurality of amplifying elements formed on the base wafer each in correspondence to the plurality of the photothermal absorbers; and a wire formed on the inhibitor to connect the plurality of the amplifying elements to the plurality of the photothermal absorbers. The seed member may generate an electric signal in response to the incident light.

According to the third aspect related to the present invention, provided is A method of producing a semiconductor wafer, including: forming an inhibitor directly or indirectly on a base wafer containing silicon; forming, in the inhibitor, an aperture in which a surface of the base wafer is exposed: forming a seed member inside the aperture: heating the seed member; making a photothermal absorber made of a Group 3-5 compound semiconductor capable of generating a carrier by absorbing light or heat undergo epitaxial growth directly or indirectly on the heated seed member with lattice-match or pseudo lattice-match with the seed member.

The aforementioned method of producing a semiconductor wafer may further include: heating the seed member, where in forming the photothermal absorber, the photothermal absorber is formed directly or indirectly on the heated seed member by epitaxial growth. In forming the seed member, the seed member made of $C_{x2}Si_{y2}Ge_{z2}Sn_{1-x2-y2-z2}$ ($0 \leq x2 \leq 3$, $0 \leq y2 \leq 1$, $0 \leq z2 \leq 1$, and $0 < x2+y2+z2 \leq 1$) or $Ga_{x3}In_{1-x3}N_{y3}P_{z3}As_{w2}Sb_{1-y3-z3-w2}$ ($0 \leq x3 \leq 1$, $0 \leq y3 \leq 1$, $0 \leq z3 \leq 1$, $0 \leq w2 \leq 1$, and $0 \leq y3+z3+w2 \leq 1$) is formed, in heating the seed member, an interface region is formed inside the base wafer to be in contact with an interface between the base wafer and the seed member, the interface region having a composition $C_{x3}Si_{y3}Ge_{z2}Sn_{1-x2-y2-z2}$ ($0 < x2 \leq 1$, $0 \leq y2' \leq 1$, $0 \leq z2 \leq 1$, $0 < x2+y2+z2 \leq 1$, and $y2 < y2' < 1$), and in forming the photothermal absorber, the photothermal absorber made of $Ga_{x1}In_{1-x1}N_{y1}P_{z1}As_{w1}Sb_{1-y1-z1-w1}$ ($0 \leq x1 \leq 1$, $0 \leq y1 \leq 1$, $0 \leq z1 \leq 1$, $0 < w1 \leq 1$, and $0 \leq y1+z1+w1 \leq 1$) is made to under go epitaxial growth.

In heating the seed member, the seed member may be irradiated with an electromagnetic wave that is to be absorbed by the seed member at a larger absorption coefficient than by the inhibitor. In an example, the electromagnetic wave is laser light.

MODE FOR CARRYING OUT THE INVENTION

Figure 1A:
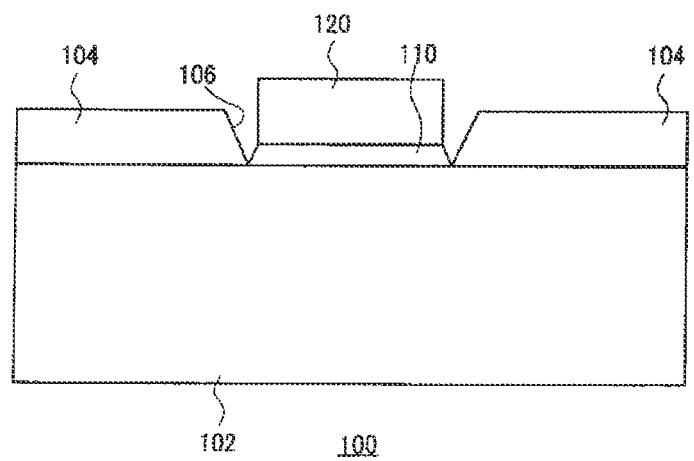
FIG. 1A shows an exemplary cross section of a semiconductor wafer 100.

FIG. 1A shows an exemplary cross section of a semiconductor wafer 100. The semiconductor wafer 100 includes a base wafer 102, an inhibitor 104, a seed member 110, and a photothermal absorber 120.

The base wafer 102 contains silicon. An example of such a wafer containing silicon is a wafer having a surface made of silicon. The base wafer 102 may be a Si wafer entirely made of silicon, or an SOI (silicon-on-insulator) wafer partially made of silicon. In an example, the base wafer 102 is a Si wafer having a B doping amount of $2.0 \times 10^{19}$ cm$^{-3}$.

The inhibitor 104 is formed directly or indirectly on the base wafer 102. The inhibitor 104 has an aperture 106 which exposes a surface of the base wafer 102. The inhibitor 104 inhibits crystal growth. Specifically, when crystals of a semiconductor are grown by an epitaxial growth method, the epitaxial growth of the crystals of the semiconductor is inhibited on the surface of the inhibitor 104. Accordingly, the crystals of the semiconductor can be epitaxially grown selectively inside the aperture 106.

The thickness of the inhibitor 104 is desirably in the range of 0.05 μm to 5 μm inclusive. The aperture 106 is desirably sized to be able to form a semiconductor selectively grown inside the aperture 106 without dislocation. For example, the inhibitor 104 may be a silicon oxide layer, a silicon nitride layer, a silicon oxynitride layer, or the like, or may be made by stacking them. The inhibitor 104 may be made by a thermal oxidation method or CVD, for example.

The seed member 110 is formed inside the aperture 106. The seed member 110 may be a semiconductor lattice-matching or pseudo lattice-matching the base wafer 102. In an example, the seed member 110 is $C_{x2}Si_{y2}Ge_{z2}S_{1-x2-y2-z2}$ ($0 \leq x2<1$, $0 \leq y2 \leq 1$, $0 \leq z2 \leq 1$, and $0<x2+y2+z2 \leq 1$). That is, the seed member 110 may be a one-dimensional semiconductor or metal, such as Si and Ge. The seed member 110 may also be a binary compound semiconductor, such as SiC, SiGe, SiSn, and GeSn. The seed member 310 may also be a ternary compound, such as CSiGe and SiGeSn. The seed member 110 may also be a quaternary compound, such as CSiGeSn.

In the present specification, "pseudo lattice-match" is used to describe a phenomenon where the difference in lattice constant between two semiconductors in contact with each other is small although not a complete lattice-match, and so the occurrence of defects due to the lattice mismatch is not noticeable and the two semiconductors can still be stacked. When the semiconductors "pseudo lattice-match," the crystal lattices of the semiconductors deform within the elastically deformable range, thereby absorbing the difference in lattice constant. For example, when Ge and GaAs, InGaAs, or InGaP are stacked, they "pseudo lattice-match."

The seed member 110 may also be $Ga_{x3}In_{1-x3}N_{y3}P_{z3}As_{w2}Sb_{1-y3-z3-w2}$ ($0 \leq x3 \leq 1$, $0 \leq y3 \leq 1$, $0 \leq z3 \leq 1$, $0 \leq w2 \leq 1$, and $0 \leq y3+z3+w2 \leq 3$). In an example, the seed member 110 is GaAs.

The seed member 110 may be made of $C_{x2}Si_{y2}Ge_{z2}Sn_{1-x2-y2-z2}$ ($0 \leq x2 \leq 1$, $0 \leq y2 \leq 1$, $0 \leq z2 \leq 1$, and $0 \leq x2+y2+z2 \leq 1$), and may further contain a crystal layer made of $C_{x2}Si_{y2}Ge_{z2}Sn_{1-x2-y2-z2}$ ($0 \leq x2 \leq 1$, $0 \leq y2' \leq 1$, $0 \leq z2 \leq 1$, and $0 \leq x2+y2+z2 \leq 1$) nearer the base wafer 102 than to the interface between the base wafer 102 and the seed member 110.

The seed member 110 may include a plurality of layers. The seed member 110 provides a crystal seed plane suited for crystal growth of the photothermal absorber 120. The seed member 110 restrains adverse effect that the impurities existing on the surface of the base wafer 102 have on the crystallinity of the photothermal absorber 120. The seed member 110 is formed to be in contact with the surface of the base wafer 102 exposed inside the aperture 106, for example by an epitaxial growth method.

The photothermal absorber 120 is a Group 3-5 compound semiconductor generating a carrier by absorbing light or heat. For example, the photothermal absorber 120 generates an electron and a hole, and outputs an electric signal. The photothermal absorber 120 may function as a thermal sensor outputting an electric signal corresponding to the amount of electron and hole increased upon reception of heat.

In an example, the photothermal absorber 120 is $Ga_{x1}In_{1-x1}N_{y1}P_{z1}As_{w1}Sb_{1-y1-z1-w1}$ ($0 \leq x1 \leq 1$, $0 \leq y1 \leq 1$, $0 \leq z1 \leq 1$, $0 \leq w1 \leq 1$, and $0 \leq y1+z1+w1 \leq 1$) lattice-matching or pseudo lattice-matching the seed member 110. The photothermal absorber 120 may include a plurality of layers. The photothermal absorber 120 may include a heterojunction. The photothermal absorber 120 may include a PN junction.

For example, the photothermal absorber 120 is formed to be in contact with the seed member 110, by an epitaxial growth method. The semiconductor wafer 100 may include another semiconductor between the seed member 110 and the photothermal absorber 120. For example, the photothermal absorber 120 may be formed by epitaxial growth on the buffer layer formed between the seed member 110 and the photothermal absorber 120.

Figure 1B:
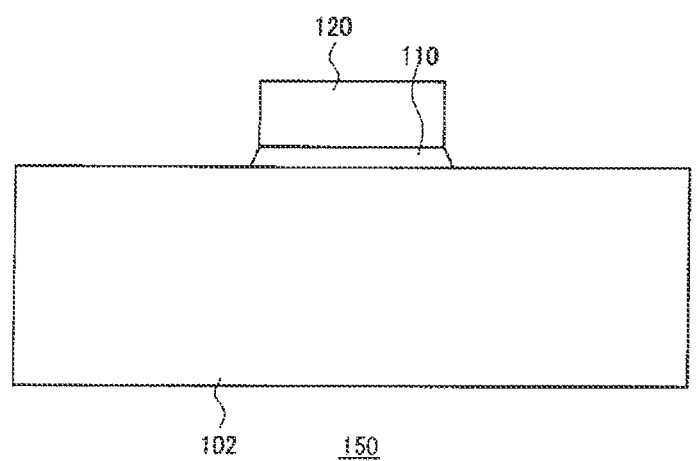
FIG. 1B shows an exemplary cross section of a sensor 150.

FIG. 1B shows an exemplary cross section of a sensor 150. The sensor 150 includes a base wafer 102, a seed member 110, and a photothermal absorber 120. The sensor 150 is formed by eliminating the inhibitor 104 from the semiconductor wafer 300. Just as the semiconductor wafer 100, the sensor 150 may include an inhibitor 104 and a seed member 110 may be formed inside an aperture 106 formed through the inhibitor 104.

Figure 2:
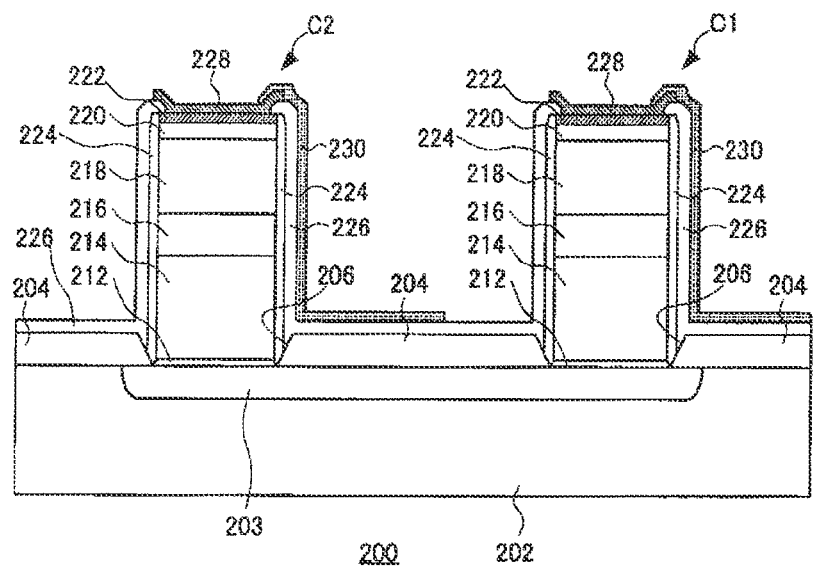
FIG. 2 shows an exemplary cross section of a sensor 200.

FIG. 2 shows an exemplary cross section of a sensor 200. The sensor 200 detects incident light, for example. The sensor 200 includes a base wafer 202, a well 203, an inhibitor 204, a first seed member 212, a second seed member 214, an anode layer 216, a drift layer 218, a cathode layer 220, a contact layer 222, a passivation layer 224, an insulation film 226, an upper electrode layer 228, and a wire 230.

The sensor 200 includes a plurality of photothermal absorbers formed inside a plurality of apertures 206 formed through the inhibitor 204. FIG. 2 shows only two photothermal absorbers (photothermal absorber C1 and photothermal absorber C2), however the sensor 200 may include more photothermal absorbers. The photothermal absorber C1 and the photothermal absorber C2 may have the same configuration as each other. Although the following explanation is mainly about the photothermal absorber C1, it also applies to the photothermal absorber C2 unless otherwise specifically mentioned for the photothermal absorber C2.

The base wafer 202 corresponds to the base wafer 102 of FIG. 1A. The base wafer 202 may be a P-type Si wafer having a doping amount of impurity atoms in the range of $1 \times 10^{14}$ $cm^{-3}$ to $1 \times 10^{21}$ $cm^{-3}$ inclusive. In an example, the base wafer 202 is a P-type Si wafer having a B doping amount, of $2 \times 10^{19}$ $cm^{-3}$.

The inhibitor 204 corresponds to the inhibitor 104. The inhibitor 204 includes a plurality of apertures 206, for example. The sensor 200 is made by providing two apertures 206 through the inhibitor 204, and selectively growing the first seed member 212 or the like inside each aperture 206.

The seed member of the sensor 200 may have a two-layer structure. For example, the photothermal absorber C1 may include a first seed member 212 and a second seed member 214. The first seed member 212 and the second seed member 214 correspond to the seed member 110 shown in FIG. 1A.

The first seed member 212 and the second seed member 214 may have respectively different compositions. For example, when the base wafer 202 is a Si wafer and the anode layer 216 is GaAs, the first seed member 212 is a SiGe crystal, and the second seed member 214 is a Ge crystal having a lattice constant similar to GaAs. Because the photothermal absorber C1 has the stated composition, the internal stress attributed to the difference in lattice constant between Si and GaAs can be effectively alleviated, to restrain formation of crystal defects.

The present embodiment explains an optical sensor configured by stacking the anode layer 216, the drift layer 218, and the cathode layer 220 in the stated order from the base wafer 202 side. However, the order in which the anode layer 216, the drift layer 218, and the cathode layer 220 are stacked may be reversed. For example, these layers may be stacked in the order of the cathode layer 220, the drift layer 218, and the anode layer 216 from the base wafer 202 side. In this case, the cathode layer 220 may be $Ga_{x1}In_{1-x1}N_{y1}P_{z1}As_{w1}Sb_{1-y1-z1-w1}$ ($0 \leq x1 \leq 1$, $0 \leq y1 \leq 1$, $0 \leq z1 \leq 1$, $0 \leq w1 \leq 1$, and $0 \leq y1+z1+w1 \leq 1$) lattice-matching or pseudo lattice-matching the second seed member 214. In the following embodiments and embodiment examples, the anode layer, the drift layer, and the cathode layer may be stacked either in the order of the anode layer, the drift layer, and the cathode layer, or in the order of the cathode layer, the drift layer, and the anode layer, from the base wafer side.

The first seed member 212 is P-type SiGe having a doping amount of impurity atoms in the range of $1 \times 10^{15}$ $cm^{-3}$ to $1 \times 10^{21}$ $cm^{-3}$ inclusive. In an example, the first seed member 212 is P-type $Si_{0.1}Ge$ having a doping amount of Ga, Al, or B of $2\times10^{19}$ cm$^{-3}$. The thickness of the first seed member 212 is in the range of 0.001 μm to 1 μm inclusive. In an example, the thickness of the first seed member 212 is 0.02 μm.

The second seed member 214 may be Ge, The second seed member 214 may have a thickness in the range of 0.05 μm to 5 μm inclusive. In an example, the thickness of the second seed member 214 is 2.0 μm.

The anode layer 216, the drift layer 218, and the cathode layer 220 correspond to the photothermal absorber 120 shown in FIG. 1A. The anode layer 216 is $Ga_{x1}In_{1-x1}N_{y1}P_{z1}As_{w1}Sb_{1-y1-z1-w1}$ ($0\leq x1\leq 1$, $0\leq y1\leq 1$, $0\leq z1\leq 1$, $0\leq w1<1$, and $0\leq y1+z1+w1\leq 1$) lattice-matching or pseudo lattice-matching the second seed member 214.

The anode layer 216 is P-type InGaAs having a doping amount of impurity atoms in the range of $5\times10^{17}$ cm$^{-3}$ to $1\times10^{21}$ cm$^{-3}$ inclusive. In an example, the anode layer 216 is P-type $In_{0.03}Ga_{0.97}As$ having a Zn doping amount equal to or greater than $5\times10^{18}$ cm$^{-3}$. The anode layer 216 may have a thickness in the range of 0.05 μm to 1 μm inclusive. In an example, the anode layer 216 has a thickness of 0.5 μm.

The anode layer 216 is formed to be in contact with the second seed member 214 by an epitaxial growth method. The photothermal absorber C1 may include another semiconductor layer between the anode layer 216 and the second seed member 214. For example, the photothermal absorber C1 includes a buffer layer between the anode layer 216 and the second seed member 214. In this case, the anode layer 216 may be formed by epitaxial growth on the buffer layer.

The drift layer 218 is $Ga_{x1}In_{1-x1}N_{y1}P_{z1}As_{w1}Sb_{1-y1-z1-w1}$ ($0\leq x1\leq 1$, $0\leq y1\leq 1$, $0\leq z1\leq 1$, $0\leq w1\leq 1$, and $0\leq y1+z1+w1\leq 1$) lattice-matching or pseudo lattice-matching the anode layer 216. For example, the drift layer 218 is formed to be in contact with the anode layer 216 by an epitaxial growth method.

The drift layer 218 may be I-type InGaAs, or may be P-type InGaAs having a doping amount of impurity atoms less than $2\times10^{16}$ cm$^{-3}$. In an example, the drift layer 218 is P-type $In_{0.03}Ga_{0.97}As$. The thickness of the drift layer 218 is in the range of 0.3 μm to 10 μm inclusive. for example. In an example, the thickness of the drift layer 218 is 1.5 μm.

The cathode layer 220 is $Ga_{x1}In_{1-x1}N_{y1}P_{z1}As_{w1}Sb_{1-y1-z1-w1}$ ($0\leq x1\leq 1$, $0\leq y1\leq 1$, $0\leq z1\leq 1$, $0\leq w1\leq 1$, and $0\leq y1+z1+w1\leq 1$) lattice-matching or pseudo lattice-matching the drift layer 218. For example, the cathode layer 220 is formed to be in contact with the drift layer 218 by an epitaxial growth method.

The cathode layer 220 is N-type InGaAs having a doping amount of impurity atoms in the range of $5\times10^{17}$ cm$^{-3}$ to $1\times10^{21}$ cm$^{-3}$ inclusive. In an example, the cathode layer 220 is N-type $In_{0.03}Ga_{0.97}As$ having a Si doping amount equal to or less than $2\times10^{18}$ cm$^{-3}$. The cathode layer 220 may have a thickness in the range of 0.05 μm to 1 μm inclusive. In an example, the cathode layer 220 has a thickness of 0.1 μm.

When the anode layer 216, the drift layer 218, and the cathode layer 220 are formed by $In_{0.03}Ga_{0.97}As$, they will have a band gap of 1.35 eV, for example. The sensor 200 can perform detection by absorbing visible light and near infrared light.

The contact layer 222 is a semiconductor provided to assure the electric conductivity between the upper electrode layer 228 formed thereabove and the cathode layer 220. For example, the contact layer 222 has the same conductivity type as the conductivity type of the cathode layer 220. The contact layer 222 is a semiconductor lattice-matching or pseudo lattice-matching the cathode layer 220. For example, the contact layer 222 is formed on the cathode layer 220 by an epitaxial growth method.

For example, the contact layer 222 is N-type GaAs having a doping amount of impurity atoms in the range of $1\times10^{18}$ cm$^{-3}$ to $1\times10^{21}$ cm$^{-3}$ inclusive. In an example, the contact layer 222 is N-type GaAs having a Si doping amount of $6\times10^{18}$ cm$^{-3}$. The contact layer 222 may have a thickness in the range of 0.02 μm to 1 μm inclusive. In an example, the contact layer 222 has a thickness of 0.05 μm.

The contact layer 222 is formed to be in contact with the cathode layer 220 by an epitaxial growth method. The photothermal absorber C1 may include another semiconductor layer between the cathode layer and the contact layer 222. For example, the photothermal absorber C1 includes a window layer between the cathode layer and the contact layer 222.

The first seed member 212, the second seed member 214, the anode layer 216, the drift layer 218, the cathode layer 220, and the contact layer 222 may be formed by an epitaxial growth method. Some examples of an epitaxial growth method are Chemical Vapor Deposition (occasionally referred to as "CVD"), Metal Organic Chemical Vapor Deposition (occasionally referred to as "MOCVD"), Molecular Beam Epitaxy (occasionally referred to as "MBE"), and Atomic Layer Deposition (occasionally referred to as "ALD").

For example, the inhibitor 204 is formed directly or indirectly on the base wafer 202 by a thermal oxidation method, and apertures 206 are formed through the inhibitor 204 which exposes the surface of the base wafer 202 by means of photolithography such as etching. Then MOCVD is used to selectively grow the first seed member 212 inside the aperture 206. Subsequently, the second seed member 214, the anode layer 216, the drift layer 218, the cathode layer 220, and the contact layer 222 are sequentially selectively grown.

By selectively growing the first seed member 212 inside the aperture 106, generation of lattice defect due to difference in lattice constant between the first seed member 232 and the base wafer 202 can be restrained. The second seed member 214, the anode layer 216, the drift layer 218, the cathode layer 220, and the contact layer 222, which have high crystallinity, are obtained, which help improve the sensitivity of the sensor 200. The first seed member 212, the second seed member 214, the anode layer 216, the drift layer 218, the cathode layer 220, and the contact layer 222 may be formed to be inside the aperture 206 of the inhibitor 204, or part of them can be formed above the inhibitor 204, protruding from the aperture 206.

The upper electrode layer 228 is formed to be in contact with the contact layer 222, for example. The upper electrode layer 228 outputs power generated by the photothermal absorber C1 to outside. The upper electrode layer 228 has a material having conductivity and not preventing the light from being incident on the photothermal absorber C1. Some examples of the material of the upper electrode layer 228 are ITO (indium tin oxide) and ZnO. For example, the upper electrode layer 228 may be formed by sputtering, or the like.

The well 203 is a low-resistance silicon crystal layer formed in the silicon contained in the base wafer 202. The photothermal absorber C1 and the photothermal absorber C2 are electrically coupled with each other, via the first seed member 212, the well 203, and the second seed member 214. In an example, the well 203 is electrically isolated from the silicon bulk region. For example, when the well 203 has a conductivity type different from the conductivity type of the silicon, a PN junction is formed between the well 203 and the silicon, to electrically isolate the well 203 from the silicon bulk region. The electric signal generated by the photothermal absorber C1 and the photothermal absorber C2 can be taken out from between the well 203 and the upper electrode layer 228.

The well 203 is formed by ion implantation. For example, the well 203 may be formed by forming, directly or indirectly on the base wafer 202, a mask having an aperture at position at which the well 203 is to be formed, by means of photolithography such as etching, and performing ion implantation. For example, a P-type well 203 may be formed by implanting B into an N-type Si base wafer 202.

The passivation layer 224 is formed on the side wall of the photothermal absorber C1, and represses recombination of charge on the side wall. The passivation layer 224 may have a larger band gap than the band gaps of the constituents of the photothermal absorber, namely, the anode layer 216, the drift layer 218, the cathode layer 220, or the like. An exemplary material of the passivation layer 224 is dielectric. Some examples of the method of forming the passivation layer 224 are plasma CVD, ion plating, sputtering, CVD, MOCVD, MBE, and ALD.

The insulation film 226 electrically isolates each photothermal absorber. Some examples of the insulation film 226 are $Al_2O_3$, $SiO_2$, and $ZrO_2$. The insulation film 226 may be formed using plasma CVD, ion plating, sputtering, CVD, MOCVD, or the like.

The wire 230 is connected to the upper electrode layer 228. The wire 230 takes out the power generated by the photothermal absorber C1 via the upper electrode layer 228. Some examples of the material of the wire 230 are Cu, Ag, and Al. The wire 230 may be formed by CVD, vacuum evaporation, sputtering, or the like.

Figure 3:
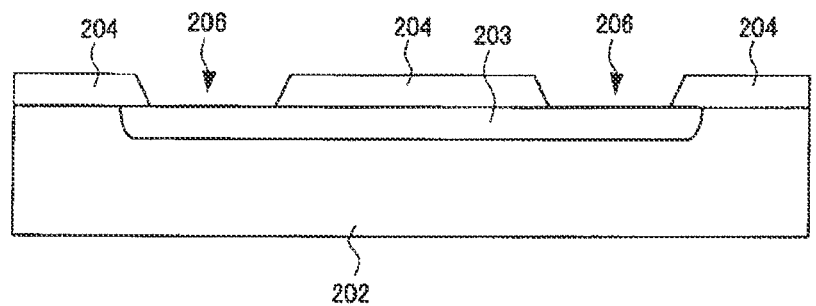
FIG. 3 shows an exemplary cross section of the sensor 200 in its production process.
Figure 4:
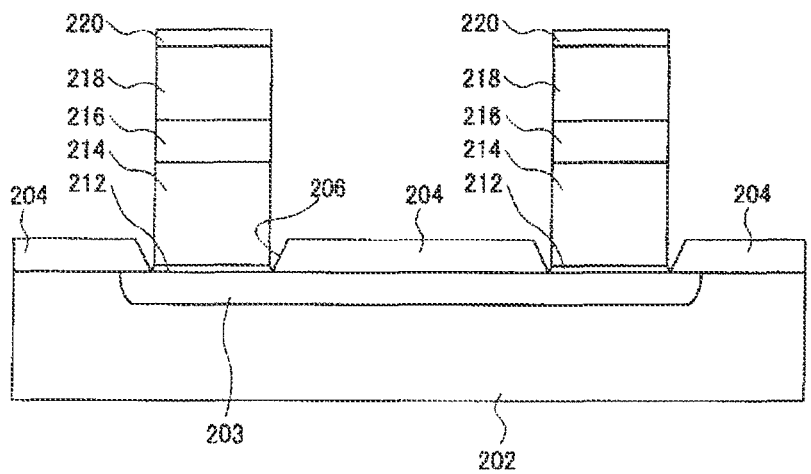
FIG. 4 shows an exemplary cross section of the sensor 200 in its production process.
Figure 5:
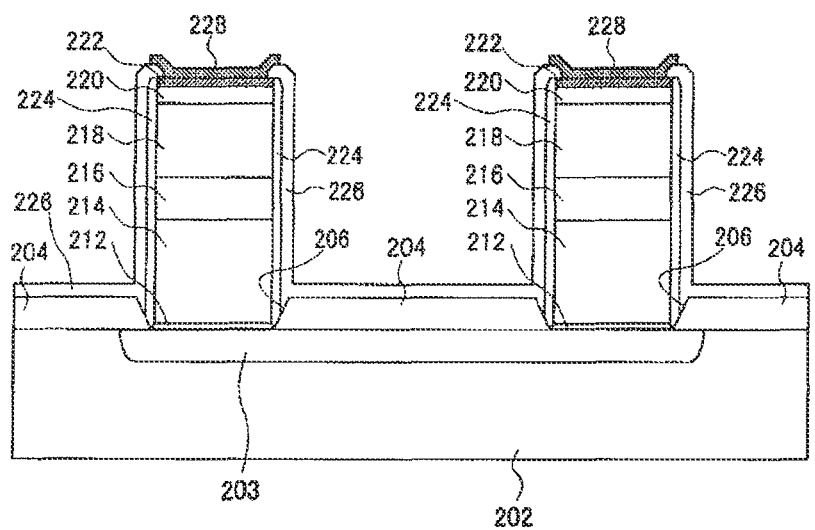
FIG. 5 shows an exemplary cross section of the sensor 200 in its production process.

FIG. 3 through FIG. 5 respectively show an exemplary cross section of the sensor 200 in its production process. The sensor 200 is produced by performing a method of producing a semiconductor wafer, which includes forming a well, forming an inhibitor, forming a seed member, heating the seed member, forming photothermal absorbers, and conducting passivation processing to complete a semiconductor wafer, and thereafter connecting the photothermal absorbers.

In forming a well, a well 203 is formed in the base wafer 202. For example, when a P-type well 203 is formed in the base wafer 202 that is an N-type silicon wafer, the well 203 can be formed by forming, directly or indirectly on the base wafer 202, a mask having an aperture at position at which the well 203 is to be formed, by means of photolithography such as etching, and implanting B ion, for example.

In forming an inhibitor, an inhibitor 204 having apertures 206 reaching the base wafer 202 is formed directly or indirectly on the base wafer 202, as shown in FIG. 3. In forming the inhibitor 204, a thermal oxidation method may be used to form a silicon oxide film on the entire surface of the base wafer 202, for example. Then on the silicon oxide film, the plurality of apertures 206 are formed which expose the surface of the base wafer 202 by means of photolithography such as etching, to complete the inhibitor 204.

In forming a seed member, as shown in FIG. 4, the first seed member 212 and the second seed member 214, made of $C_{x2}Si_{y2}Ge_{z2}Sn_{1-x2-y2-z2}$ ($0 \le x2 \le 1$, $0 \le y2 \le 1$, $0 \le z2 \le 1$, and $0-x2+y2+z2 \le 1$) or $Ga_{x3}In_{1-x3}N_{y3}P_{z3}As_{w2}Sb_{1-y3-z3-w2}$ ($0 \le x3 \le 1$, $0 \le y3 \le 1$, $0 \le z3 \le 1$, $0 \le w2 \le 1$, and $0 \le y3+z3+w2 \le 1$) are formed inside the apertures 206 by a selective epitaxial growth method. For example, the MOCVD may be used to epitaxially grow the first seed member 212 that is P-type SiGe and the second seed member 214 that is P-type Ge.

Specifically, the Si base wafer 202 on which an inhibitor 204 having apertures 206 has been formed is mounted on the heating platform of the reduced pressure barrel-type MOCVD chamber. Next, substitution of highly pure hydrogen is sufficiently performed in the chamber, and then the base wafer 202 is started to be heated. The wafer temperature at the time of crystal growth is in the range of 500 degrees centigrade to 800 degrees centigrade, for example. When the temperature of the base wafer 202 is stabilized at an adequate level, a Si source is introduced into the chamber, followed by introduction of a Ge source, to epitaxially grow the first seed member 212 that is P-type SiGe. Directly or indirectly on the first seed member 212, the second seed member 214 that is P-type Ge may be epitaxially grown.

Some examples of Si source are chlorosilane, dichlorosilane, trichlorosilane, tetrachlorosilane, silane, or disilane. Some examples of Ge source are germane and tetramethyl germanium ($(CH_3)_4Ge$). It is also possible to use Ga as an acceptor impurity atom, and trimethylgallium (TMG) as a compound containing an impurity atom exhibiting a conductivity type of P.

An example of the epitaxial growth condition is the pressure in the reaction chamber of 0.1 atm, the growth temperature of 650 degrees centigrade, and the growth rate of 1 to 3 μm/hr. Highly pure hydrogen may be used as a carrier gas of a source. Each semiconductor explained later may also be epitaxially grown in the same MOCVD, with adequate adjustment of parameters such as source gas, pressure in the chamber, growth temperature, and growth duration.

In heating the seed member, the first seed member 212 and the second seed member 214 are heated. By heating the first seed member 212 and the second seed member 214, the lattice defects such as dislocation attributed to the difference in lattice constant between the base wafer 202, and the first seed member 212 and the second seed member 214 are reduced in the first seed member 212 and the second seed member 214, to improve the crystallinity of the first seed member 212 and the second seed member 214. The mentioned heating may be performed in plurality of phases. For example, after performing high-temperature annealing at a temperature not reaching the melting point of the first seed member 212 and of the second seed member 214, a low-temperature annealing is conducted at a temperature lower than the temperature adopted in the high-temperature annealing. Such a two-phase annealing may be repeated several times.

In heating the seed member, a crystal layer made of $C_{x2}Si_{y2}Ge_{z2}Sn_{1-x2-y2-z2}$ ($0 \le x2 \le 1$, $0 < y2' \le 1$, $0 \le z2 \le 1$, and $0 \le x2+y2+z2 \le 1$, and $y2 < y2' \le 1$) may be formed nearer the base wafer 202 than to the interface between the base wafer 202 and the first seed member 212. In heating the seed member, the seed member is selectively irradiated with an electromagnetic wave absorbed by the seed member at a larger absorption coefficient than by the inhibitor. The electromagnetic wave may be laser light, for example.

Heating of the first seed member 212 and the second seed member 214 may be performed after formation of the first seed member 212 and the second seed member 214. Alternatively, the heating may be performed after formation of only the first seed member 212 that is P-type SiGe. In this case, the temperature and duration condition for the high-temperature annealing is in the range of 850 to 900 degrees centigrade for two to 10 minutes, and the temperature and duration condition for the low-temperature annealing is in the range of 650 to 780 degrees centigrade for two to 10 minutes, for example.

In forming photothermal absorbers, as shown in FIG. 4, directly or indirectly on the second seed member 214, the anode layer 216, the drift layer 218, and the cathode layer 220 made of $Ga_{x1}In_{1-x1}N_{y1}P_{z1}As_{w1}Sb_{1-y1-z1-w1}$ ($0 < x1 \le 1$, $0 \le y1 \le 1$, $0 \le z1 \le 1$, $0 \le w1 \le 1$, and $0 \le y1+z1+w1 \le$) are sequentially formed to lattice-match or pseudo lattice-match the second seed member 214. For example, the MOCVD is used to form, by epitaxial growth, the anode layer 216 that is P-type $In_{0.03}Ga_{0.97}As$ is formed to be in contact with the second seed member 214. Thereafter, directly or indirectly on the anode layer 216, the drift layer 218 that is P-type $In_{0.03}Ga_{0.97}As$ and the cathode layer 220 that is N-type $In_{0.03}Ga_{0.97}As$ may be sequentially epitaxially grown. The contact layer 222 that is N-type GaAs may further be formed by-epitaxial growth.

Arsine ($AsH_3$) may be used as an As source. An example of In source is trimethylindium (TMI). C, Zn, or the like may also be used as an acceptor impurity atom. Some examples of donor impurity atoms are P, Si, Se, Ge, Sn, Te, or S.

In conducting passivation processing, after the passivation layer 224 and the insulation film 226 have been formed on the side walls of the photothermal absorber C1 and the photothermal absorber C2, the upper electrode layer 228 is formed, as shown in FIG. 5. For example, the MOCVD is used to epitaxially form the passivation layer 224 that is InGaP, on the side surfaces of the photothermal absorber C1 and the photothermal absorber C2. For example, the insulation film 226 can be obtained by forming an $Al_2O_3$ film, a $SiO_2$ film, or a $ZrO_2$ film by sputtering.

Next, by means of photolithography such as etching, the insulation film 226 is partially removed at a position at which the upper electrode layer 228 is to be formed to provide an aperture, thereby exposing the contact layer 222. Subsequently, a mask having an aperture at which the upper electrode layer 228 is to be formed is formed, and thereafter the upper electrode layer 228 (e.g., made of ITO) is formed by sputtering. Then by lifting off the mask, the upper electrode layer 228 completes as shown in FIG. 5.

In connecting the photothermal absorbers, the wire 230 is formed to connect the photothermal absorber C1 to the photothermal absorber C2 as shown in FIG. 2. For example, a mask having an aperture at which the wire 230 is to be formed is formed, and thereafter a metal film (e.g., made of Al) is evaporated by vacuum evaporation. The wire 230 completes by lifting off the mask.

In FIG. 2, the anode layer 216 of the photothermal absorber C1 is electrically connected to the anode layer 216 of the photothermal absorber C2, by means of the well 203. Consequently, by connecting respective cathode layers 220 by means of the wire 230, the photothermal absorber C1 and the photothermal absorber C2 can be connected in parallel.

Figure 6:
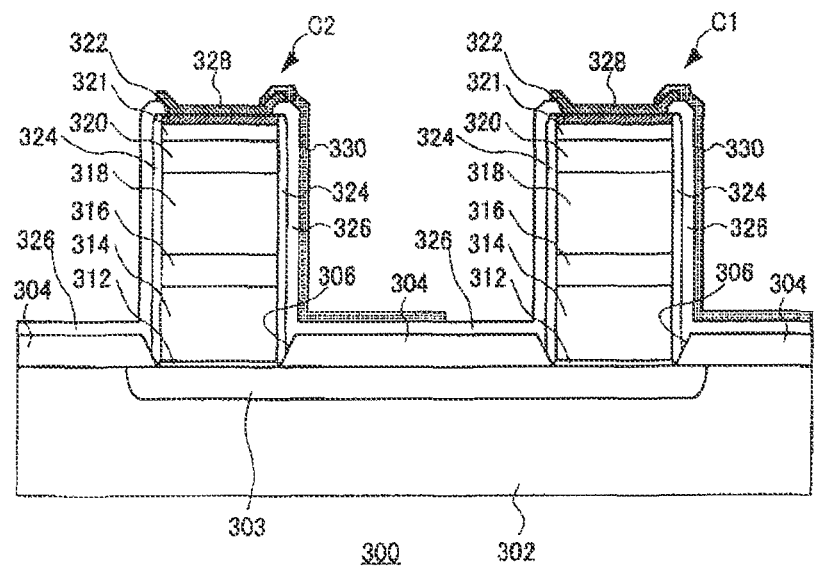
FIG. 6 shows an exemplary cross section of a sensor 300.

FIG. 6 shows an exemplary cross section of a sensor 300. The sensor 300 includes a base wafer 302, a well 303, an inhibitor 304, a seed member 312, a buffer layer 314, an anode layer 316, a drift layer 318, a cathode layer 320, a window 321, a contact layer 322, a passivation layer 324, an insulation film 326, an upper electrode layer 328, and a wire 330.

The base wafer 302 corresponds to the base wafer 202 In FIG. 2. The well 303 corresponds to the well 203 in FIG. 2. The inhibitor 304 corresponds to the inhibitor 204 in FIG. 2. The seed member 312 corresponds to the first seed member 212 in FIG. 2, and may be SiGe, for example.

The contact layer 322 corresponds to the contact layer 222 in FIG. 2. The passivation layer 324 corresponds to the passivation layer 224 in FIG. 2. The insulation film 326 corresponds to the insulation film 226 in FIG. 2. The upper electrode layer 328 corresponds to the upper electrode layer 228 in FIG. 2. The wire 330 corresponds to the wire 230 in FIG. 2. In the explanation of the sensor 300, the description of the constituents thereof that correspond to their counterparts in the sensor 200 is occasionally omitted.

The buffer layer 314 may have a larger band gap than the band gaps of the anode layer 316, the drift layer 318, the cathode layer 320, or the like. The buffer layer 314 is a semiconductor that represses recombination of charge generated due to the photoelectric effect of the photothermal absorber C1 and the photothermal absorber C2. The buffer layer 314 is formed directly or indirectly on the seed member 312, for example. The buffer layer 314 is a semiconductor lattice-matching or pseudo lattice-matching the seed member 312.

The buffer layer 314 is P-type InP having a doping amount of impurity atoms in the range of $1\times10^{18}$ $cm^{-3}$ to $5\times10^{19}$ $cm^{-3}$ inclusive. In an example, the buffer layer 314 is P-type InP having a Zn doping amount equal to or greater than $5\times10^{18}$ $cm^{-3}$. The thickness of the buffer layer 314 is in the range of 0.1 μm to 5 μm inclusive. For example, the thickness of buffer layer 314 is 0.5 μm.

The buffer layer 314 is formed to be in contact with the seed member 312, for example by the epitaxial growth method. Some examples of an epitaxial growth method are CVD, MOCVD, MBE, and ALD. For example, the MOCVD may be used to form the buffer layer 314 to be in contact with the seed member 312 having been selectively grown inside the aperture 306 of the inhibitor 304 by epitaxial growth. The buffer layer 314 may be formed to be inside the aperture 306 of the inhibitor 304, or part of the buffer layer 314 can be formed above the inhibitor 304, protruding from the aperture 306. When forming a buffer layer 314 made of InP, an example of In source is trimethylindium (TMI). An example of P source is phosphine ($PH_3$).

The anode layer 316 corresponds to the anode layer 216 in FIG. 2. The anode layer 316 is $Ga_{x1}In_{1-x1}N_{y1}P_{z1}As_{w1}Sb_{1-y1-z1-w1}$ ($0\leq x1\leq 1$, $0\leq y1<1$, $0\leq z1\leq 1$, $0\leq w1\leq 1$, and $0\leq y1+z1+w1\leq 1$) lattice-matching or pseudo lattice-matching the buffer layer 314.

The anode layer 316 is P-type InGaAs having a doping amount of impurity atoms in the range of $5\times10^{17}$ $cm^{-3}$ to $5\times10^{19}$ $cm^{-3}$ inclusive. In an example, the anode layer 316 is p-type $In_{0.5}Ga_{0.5}As$ having a Zn doping amount equal to or greater than $5\times10^{18}$ $cm^{-3}$. The anode layer 316 may have a thickness in the range of 0.1 μm to 2 μm inclusive. In an example, the anode layer 316 has a thickness of 0.2 μm. The anode layer 316 is formed to be in contact with the buffer layer 314 by epitaxial growth.

The drift layer 318 corresponds to the drift layer 218 in FIG. 2. The drift layer 318 is $Ga_{x1}In_{1-x1}N_{y1}P_{z1}As_{w1}Sb_{1-y1-z1-w1}$ ($0\leq x1\leq 1$, $0\leq y1\leq 1$, $0\leq z1\leq 1$, $0\leq w1\leq 1$, and $0\leq y1+z1+w1\leq 1$) lattice-matching or pseudo lattice-matching the anode layer 316. For example, the drift layer 318 is formed to be in contact with the anode layer 316 by epitaxial growth.

The drift layer 318 may be I-type InGaAs, or may be P-type InGaAs having a doping amount of impurity atoms less than $2\times10^{16}$ $cm^{-3}$. In an example, the drift layer 318 is P-type $In_{0.5}Ga_{0.5}As$. The thickness of the drift layer 318 is in the range of 0.3 μm to 10 μm inclusive, for example. In an example, the thickness of the drift layer 318 is 1.5 μm.

The cathode layer 320 corresponds to the cathode layer 220 in FIG. 2. For example, the cathode layer 320 is $Ga_{x1}In_{1-x1}N_{y1}P_{z1}As_{w1}Sb_{1-y1-z1-w1}$ ($0\leq x1\leq 1$, $0\leq y1\leq 1$, $0\leq z1<1$, $0\leq w1\leq 1$, and $0\leq y1+z1+w1\leq 1$) lattice-matching or pseudo lattice-matching the drift layer 318. The cathode layer 320 is formed to be in contact with the drift layer 318 by epitaxial growth, for example.

The cathode layer 320 is N-type InGaAs having a doping amount of impurity atoms in the range of $5\times10^{17}$ $cm^{-3}$ to $5\times10^{19}$ $cm^{-3}$ inclusive. In an example, the cathode layer 320 is N-type $In_{0.5}Ga_{0.5}As$ having a Si doping amount of $2\times10^{18}$ $cm^{-3}$. The cathode layer 320 may have a thickness in the range of 0.1 μm to 2 μm inclusive. In an example, the cathode layer 320 has a thickness of 0.1 μm.

When the anode layer 316, the drift layer 318, and the cathode layer 320 are formed by $In_{0.5}Ga_{0.5}As$, they will have a band gap of 0.89 eV, for example. The sensor 300 can perform detection by absorbing near infrared light.

The window 321 is a semiconductor that represses recombination of charge generated due to the photoelectric effect of the photothermal absorbers. The window 321 may have a larger band gap than the band gaps of the anode layer 316, the drift layer 318, the cathode layer 320, or the like. The window 321 is formed directly or indirectly on the cathode layer 320, for example. The window 321 is a semiconductor lattice-matching or pseudo lattice-matching the cathode layer 320.

The window 321 is N-type InP having a doping amount of impurity atoms in the range of $5 \times 10^{17}$ $cm^{-3}$ to $5 \times 10^{19}$ $cm^{-3}$ inclusive. In an example, the window 321 is N-type InP having a Si doping amount of $5 \times 10^{18}$ $cm^{-3}$. The thickness of the window 321 is in the range of 0.05 μm to 2 μm inclusive, for example. In an example, the thickness of the window 321 is 0.1 μm.

For example, the window 321 is formed to be in contact with the cathode layer 320 by epitaxial growth. Some examples of an epitaxial growth method are CVD, MOCVD, MBE, and ALD. For example, the MOCVD may be used to form the window 321 to be in contact with the cathode layer 320 having been selectively grown, by epitaxial growth. The window 321 may be formed to be inside the aperture 306 of the inhibitor 304, or part of the window 321 can be formed above the inhibitor 304, protruding from the aperture 306. When forming a window 321 made of InP, an example of In source is trimethylindium (TMI). An example of P source is phosphine ($PH_3$).

Figure 7:
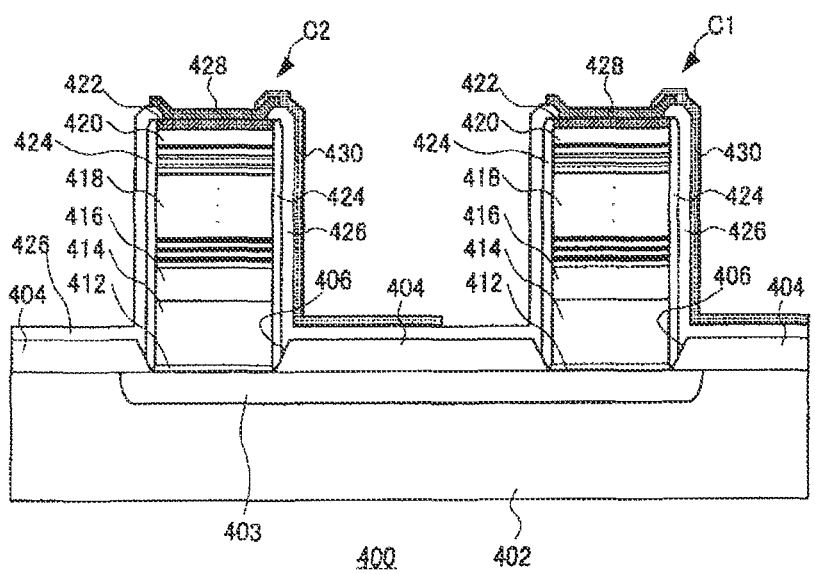
FIG. 7 shows an exemplary cross section of a sensor 400.

FIG. 7 shows an exemplary cross section of a sensor 400. The sensor 400 includes a base wafer 402, a well 403, an inhibitor 404, apertures 406, a first seed member 412, a second seed member 414, an anode layer 416, a drift layer 418, a cathode layer 420, a contact layer 422, a passivation layer 424, an insulation film 426, an upper electrode layer 428, and a wire 430.

The base wafer 402 corresponds to the base wafer 202 in FIG. 2. The well 403 corresponds to the well 203 in FIG. 2. The inhibitor 404 and the apertures 406 correspond to the inhibitor 204 and the apertures 206 in FIG. 2. The first seed member 412 corresponds to the first seed member 212 in FIG. 2. The second seed member 414 corresponds to the second seed member 214 in FIG. 2 and may be SiGe or Ge.

The anode layer 416 corresponds to the anode layer 216 in FIG. 2. The cathode layer 420 corresponds to the cathode layer 220 in FIG. 2. The contact layer 422 corresponds to the contact layer 222 in FIG. 2. The passivation, layer 424 corresponds to the passivation layer 224 in FIG. 2. The insulation film 426 corresponds to the insulation film 226 in FIG. 2.

The upper electrode layer 428 corresponds to the upper electrode layer 228 in FIG. 2. The wire 430 corresponds to the wire 230 in FIG. 2. In the explanation of the sensor 400, the description of the constituents thereof that correspond to their counterparts in the sensor 200 is occasionally omitted.

The drift layer 418 corresponds to the drift layer 218 in FIG. 2. The drift layer 418 is a superlattice structure made by stacking a first layer and a second layer, where the first layer is made of $Ga_{x1}In_{1-x1}N_{y1}P_{z1}As_{w1}Sb_{1-y1-z1-w1}$ ($0 \leq x1 \leq 1$, $0 \leq y1 \leq 1$, $0 \leq z1 \leq 1$, $0 \leq w1 \leq 1$, and $0 \leq y1+z1+w1 \leq 1$) and the second layer is made of $Ga_{x4}In_{1-x4}N_{y4}P_{z4}As_{w3}Sb_{1-y4-z4-w3}$ ($0 \leq x4 \leq 1$, $0 \leq y4 \leq 1$, $0 \leq z4 \leq 1$, $0 \leq w3 \leq 1$, and $0 \leq y4+z4+w3 \leq 1$) and has a band gap larger than the band gap of the first layer.

For example, the superlattice structure may be formed by repeating, 75 times, a two-layer structure made of the first layer made of InGaAs and the second layer made of GaInP having a band gap larger than the band gap of InGaAs. In such a superlattice structure, the first layer made of InGaAs has a thickness in the range of 0.003 μm to 0.02 μm inclusive. In an example, the thickness of the first layer made of InGaAs is 0.005 μm. The second layer made of GaInP may have a thickness in the range of 0.01 μm to 0.05 μm inclusive. In an example, the thickness of the second layer made of GaInP is 0.013 μm.

By designing the drift layer 418 to have a superlattice structure, a subband is formed in the conduction band. The electron transition between the subbands enables the photothermal absorber C1 and the photothermal absorber C2 to absorb light having a long wavelength. The photothermal absorber C1 and the photothermal absorber C2 can perform detection by absorbing light such as near infrared light corresponding to the band gap, for example.

Figure 8:
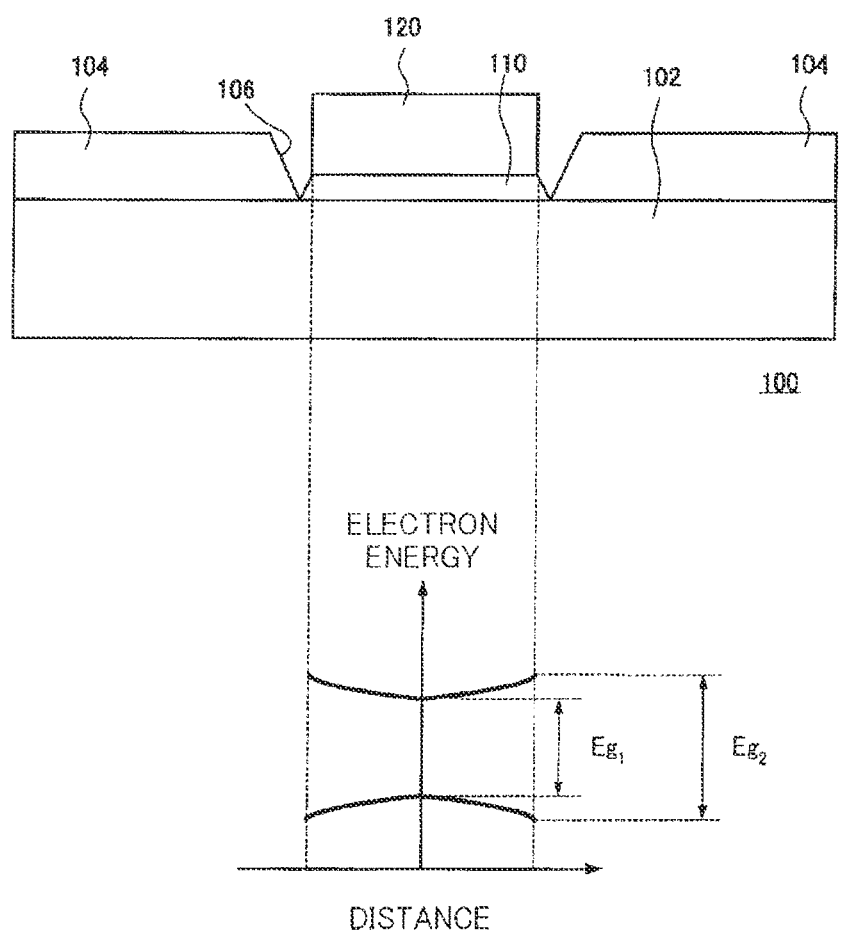
FIG. 8 shows an example of an energy band of the photothermal absorber in the semiconductor wafer 100.

FIG. 8 shows an example of an energy band of the photothermal absorber in the semiconductor wafer 100. The upper part of FIG. 8 shows a cross section of the semiconductor wafer 100. The lower part of FIG. 8 shows an energy band of the photothermal absorber 120. The horizontal axis shows a position of the photothermal absorber 120 within the plane, which is parallel to the base wafer 102. The vertical axis shows an energy band of the photothermal absorber 120. The lower curve represents the upper edge of the valence band and the upper curve represents the lower edge of the conduction band. The interval between the upper curve and the lower curve represents the band gap.

For example, the photothermal absorber 120 has a composition distribution causing a larger band gap at position within the plane parallel to the base wafer 102 which is distanced farther from the center of the plane parallel to the base wafer 102. In other words, the photothermal absorber 120 has a composition distribution causing a larger band gap at a periphery compared to the central portion.

For example, for the photothermal absorber 120, there are a band gap of Eg1 at the central portion of the photothermal absorber 120, and a band gap of Eg2 larger than Eg1 at the periphery; as shown in FIG. 8. When the photothermal absorber 120 is SiGe, by gradually increasing the composition of Si from the central portion towards the periphery, the photothermal absorber 120 will have a band gap that changes as shown in FIG. 8. When the photothermal absorber 120 is $Ga_{x1}In_{1-x1}N_{y1}P_{z1}As_{w1}Sb_{1-y1-z1-w1}$ ($0 \leq x1 \leq 1$, $0 \leq y1 \leq 1$, $0 \leq z1 \leq 1$, $0 \leq w1 \leq 1$, and $0 \leq y1+z1+w1 \leq 1$), and when x1 is not 1, the photothermal absorber 120 will have a band gap that changes as shown in FIG. 8, by realizing a composition distribution having a smaller ratio of In at position distanced farther from the center.

If the periphery of the photothermal absorber 120 has a band gap Eg2 wider than that of the central portion, the recombination of the carrier generated by photoelectric conversion is restrained at the periphery. Each of the anode layer 216, the drift layer 218, and the cathode layer 220 in the sensor 200 described above can have such a band gap changing as shown in FIG. 8 in the plane parallel to the base wafer 202.

Figure 9:
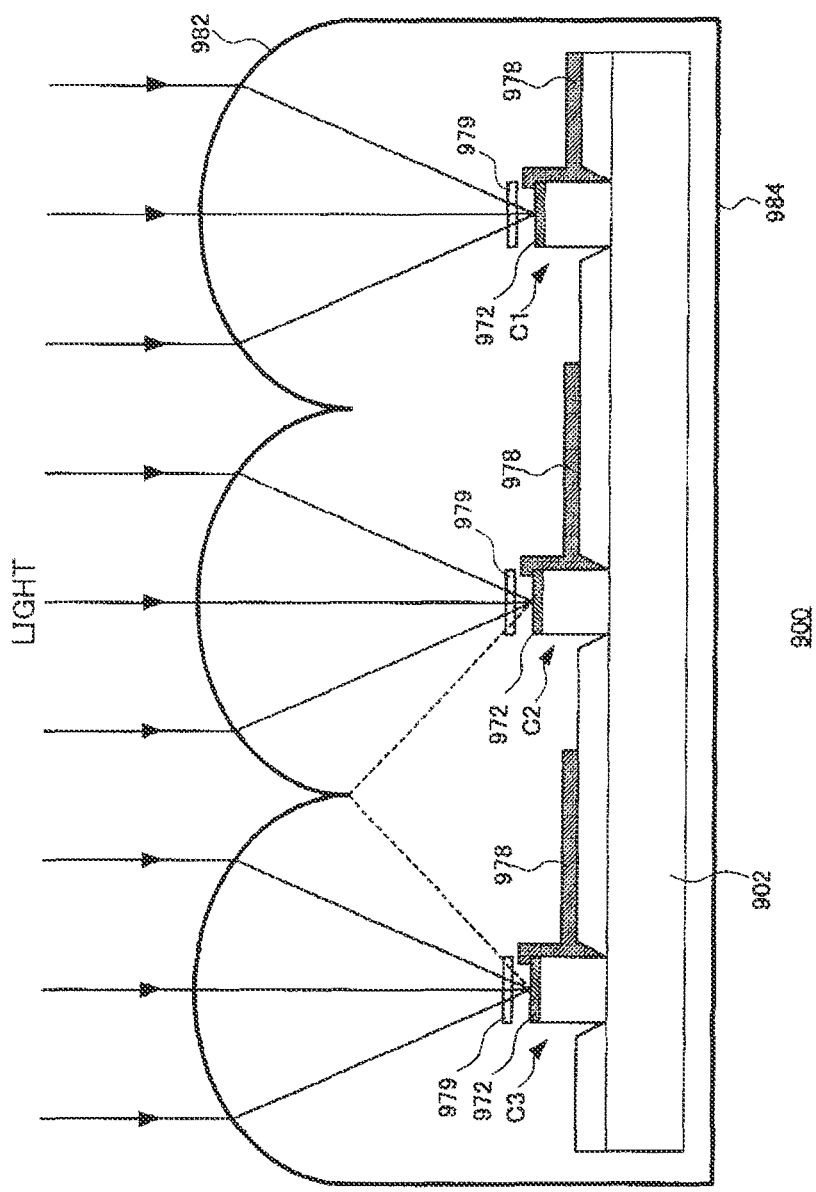
FIG. 9 shows an exemplary cross section of a sensor 900.

FIG. 9 shows an exemplary cross section of a sensor 900. The sensor 900 includes a base wafer 902, an upper electrode layer 972, a wire 978, an optical filter 979, a photothermal absorber C1, a photothermal absorber C2, a photothermal absorber C3, a light, collecting member 982, and a sealing member 984.

The base wafer 902 corresponds to the base wafer 202 of the sensor 200. The upper electrode layer 972 corresponds to the upper electrode layer 228. The wire 978 corresponds to the wire 230. The photothermal absorber C1, the photothermal absorber C2, and the photothermal absorber C3 correspond to the photothermal absorber C1 of either the sensor 268, the sensor 390, or the sensor 400. Although the following explanation is mainly about the photothermal absorber C1, it also applies to the photothermal absorber C2 and the photothermal absorber C3 unless otherwise specifically mentioned for the photothermal absorber C2 and the photothermal absorber C3.

The light collecting member 982 focuses incident light. The light collecting member 982 is an optical lens. The light collecting member 982 may be made of a material that transmits light, such as glass or plastic. The light collecting member 982 is a member having a lens effect of collecting light.

The light collecting member 982 is provided at a position that enables the focused light to be incident on the photothermal absorber C1, the photothermal absorber C2, or the photothermal absorber C3. The sensor 900 may include a plurality of light collecting members 982 each of which is provided to a corresponding one of the photothermal absorbers. The plurality of light collecting members 982 collecting light incident on the photothermal absorbers may be integrally formed as shown in FIG. 9.

The optical filter 979 is provided on the path of the incident light, for example. The optical filter 979 has a function of absorbing or reflecting light of a longer wavelength than the wavelength corresponding to the band gap of the photothermal absorber C1. The optical filter 979 may have a radiation resistant film containing heavy metal.

As shown in FIG. 9, the sealing member 984 may be used to integrally seal the sensor 900. The sealing member 984 may be made by a transparent material such as glass or plastic. The sealing member 984 may be integrally formed with the light collecting member 982. The light collecting member 982 may be retained by the sealing member 984.

The sensor 900 may include amplifying elements formed on the base wafer 902, each of which corresponds to one of the photothermal absorbers. Each amplifying element is connected to a corresponding photothermal absorber via the wire 978. The amplifying elements amplify an electric signal generated by the photothermal absorbers. The wire 978 is formed directly or indirectly on the inhibitor, for example.

Figure 10:
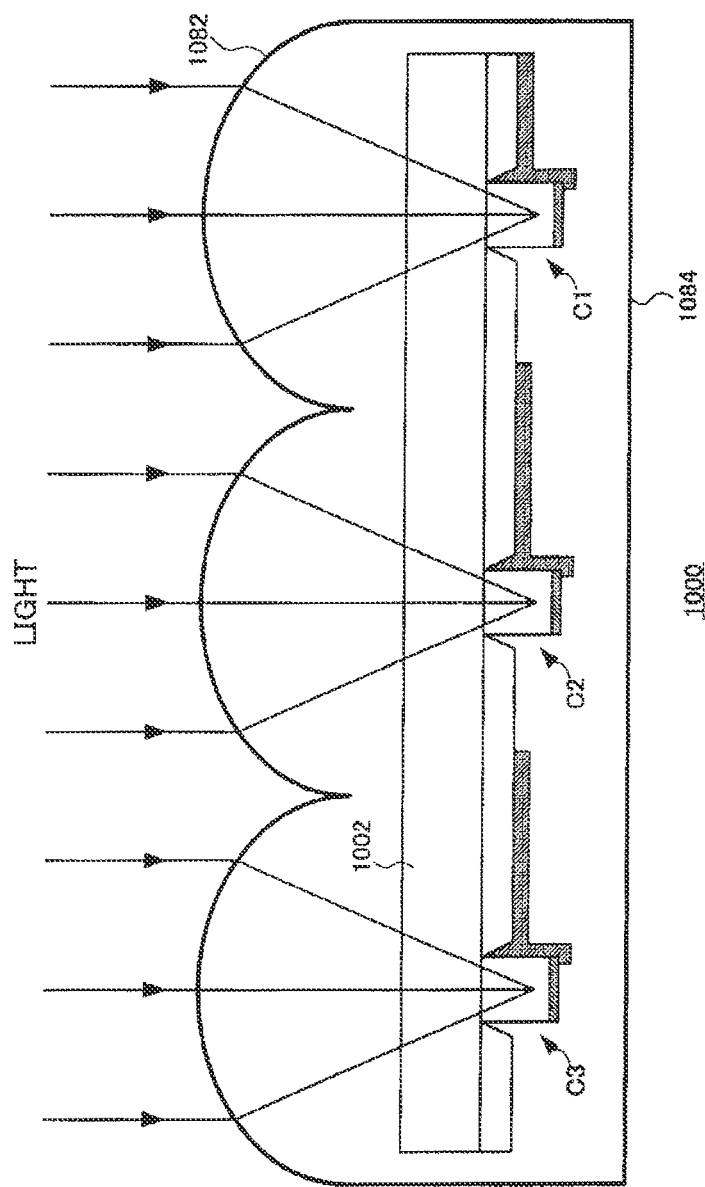
FIG. 10 shows an exemplary cross section of a sensor 1000.

FIG. 10 shows an exemplary cross section of a sensor 1000. The sensor 1000 includes a base wafer 1002, a photothermal absorber C1, a photothermal absorber C2, a photothermal absorber C3, a light collecting member 1082, and a sealing member 1084. The base wafer 1002 corresponds to the base wafer 902 of the sensor 900.

The sensor 1000 detects light incident from a plane opposite to a plane of the base wafer 1002 provided with the photothermal absorber C1, the photothermal absorber C2, and the photothermal absorber C3. When the incident light is infrared light that can transmit through silicon, the incident light transmits through the base wafer 1002, to be incident on the photothermal absorber C1, the photothermal absorber C2, and the photothermal absorber C3.

The light collecting member 1082 corresponds to the light collecting member 982 of the sensor 900. The light collecting member 1082 focuses light to be incident on the photothermal absorber C1, the photothermal absorber C2, and the photothermal absorber C3. The light collecting member 1082 is positioned to input the focused light onto the photothermal absorber C1, the photothermal absorber C2, and the photothermal absorber C3. The sensor 900 may include a plurality of light collecting members 1082 each of which is provided to correspond to one of the photothermal absorbers. The plurality of light collecting members 1082 collecting light to be incident on the photothermal absorbers may be integrally formed as shown in FIG. 10.

When the base wafer 1002 is a Si wafer, the light collecting member 1082 may be a lens that focuses the infrared light transmittable through the Si base wafer 1002 and inputs it to the photothermal absorber C1. The Si base wafer 1002 absorbs light having energy equal to or greater than the band gap of Si, to have a type of filtering effect.

Figure 11:
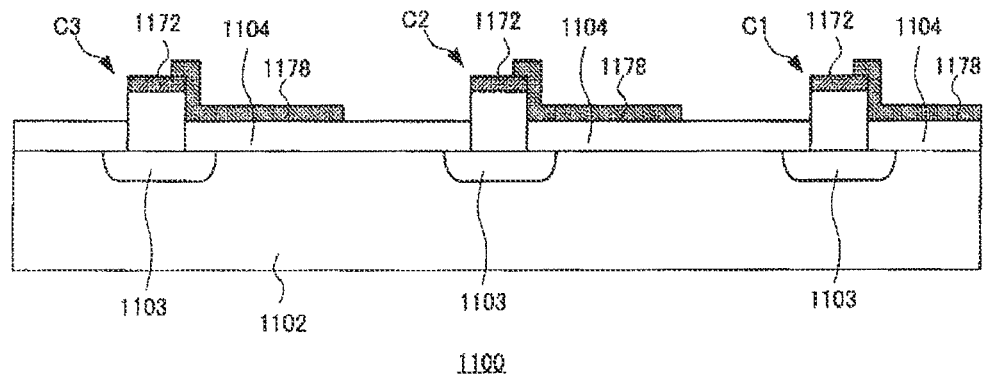
FIG. 11 shows an exemplary cross section of a sensor 1100.

FIG. 11 shows an exemplary cross section of a sensor 1100. The sensor 1100 includes a base wafer 1102, wells 1103, an inhibitor 1104, upper electrode layers 1172, wires 1178, a photothermal absorber C1, a photothermal absorber C2, and a photothermal absorber C3.

The base wafer 1102 corresponds to the base wafer 202 of the sensor 200. The wells 1103 correspond to the well 203. The inhibitors 1104 correspond to the inhibitor 204. The upper electrode layers 1172 correspond to the upper electrode layer 228. The wires 1178 correspond to the wire 230. The photothermal absorber C1, the photothermal absorber C2, and the photothermal absorber C3 correspond to the photothermal absorber C1 of the sensor 200.

As shown in FIG. 11, in the sensor 1100, the wells 1103 in contact with the bottoms of the photothermal absorbers are separate and independent from each other. By using the wire 1178 to connect the upper electrode layer 1172 of the photothermal absorber C3 to the well 1103 formed under the photothermal absorber C2, as well as connecting the upper electrode layer 1172 of the photothermal absorber C2 to the well 1103 formed under the photothermal absorber C1, the photothermal absorber C1, the photothermal absorber C2, and the photothermal absorber C3 can be connected in series. For example, the electric signal generated by the sensor 1100 is outputted from between the upper electrode layer 1172 of the photothermal absorber C1 and the well 1103 of the photothermal absorber C3.

In addition, by using the wire 1178 to connect the upper electrode layer 1172 of the photothermal absorber C1, the upper electrode layer 1172 of the photothermal absorber C2, and the upper electrode layer 1172 of the photothermal absorber C3, as well as using a wire different from the wire 1178 to connect the well 1103 under the photothermal absorber C1, the well 1103 under the photothermal absorber C2, and the well 1103 under the photothermal absorber C3, the photothermal absorber C1, the photothermal absorber C2, and the photothermal absorber C3 can be connected in parallel. Although three photothermal absorbers are connected in the above-described example, the sensor 1100 may include more photothermal absorbers connected to each other.

Figure 12:
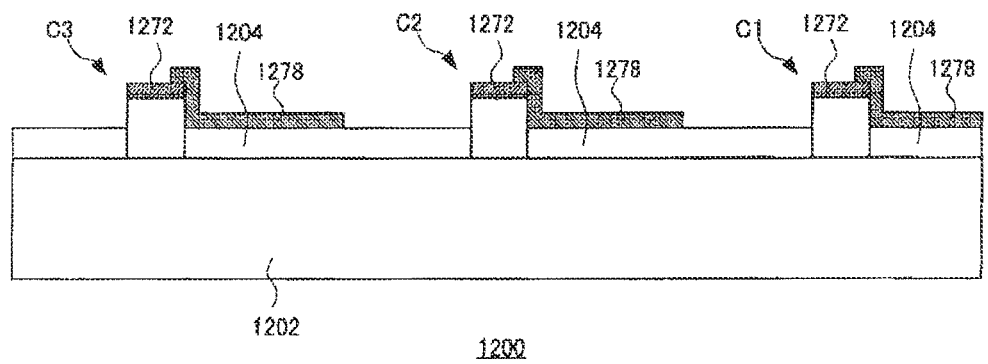
FIG. 12 shows an exemplary cross section of a sensor 1200.

FIG. 12 shows an exemplary sensor 1200. The sensor 1200 includes a base wafer 1202, an inhibitor 1204, upper electrode layers 1272, wires 1278, a photothermal absorber C1, a photothermal absorber C2, and a photothermal absorber C3.

The base wafer 3202 corresponds to the base wafer 202 of the sensor 200. The inhibitor 1204 corresponds to the inhibitor 204. The upper electrode layers 1272 correspond to the upper electrode layer 228. The wires 1278 correspond to the wire 230. The photothermal absorber C1, the photothermal absorber C2, and the photothermal absorber C3 correspond to the photothermal absorber C1 of the sensor 200.

The entire base wafer 1202 has conductivity. The anode layers of the photothermal absorber C1, the photothermal absorber C2, and the photothermal absorber C3 are electrically coupled to the base wafer 1202 via a seed member. The anode layers of the photothermal absorber C1, the photothermal absorber C2, and the photothermal absorber C3 may be electrically coupled to each other via the base wafer 1202. In such a case, by using the wire 1278 to connect the upper electrode layer 1272 of the photothermal absorber C1, the upper electrode layer 1272 of the photothermal absorber C2, and the upper electrode layer 1272 of the photothermal absorber C3, the photothermal absorber C1, the photothermal absorber C2, and the photothermal absorber C3 may be connected in parallel. Although three photothermal absorbers are connected in the above-described example, the sensor 1200 may include more photothermal absorbers connected to each other.

In the above-described embodiment, an inhibitor having an aperture is formed directly or indirectly on a Si wafer, and a seed member and a photothermal absorber are formed by epitaxial growth inside the aperture. Accordingly, the lattice defects attributed to the difference in lattice constant between Si and the compound semiconductor can be reduced, to obtain a photothermal absorber having high crystallinity. By enhancing the crystal unity of the photothermal absorber, a sensor having stable characteristics has been obtained. In addition, by combining the light collecting members, light can be efficiently focused to be incident on the photothermal absorber, to enhance the sensitivity of the sensor.

EXAMPLES

Embodiment Example No. 1

Figure 13:
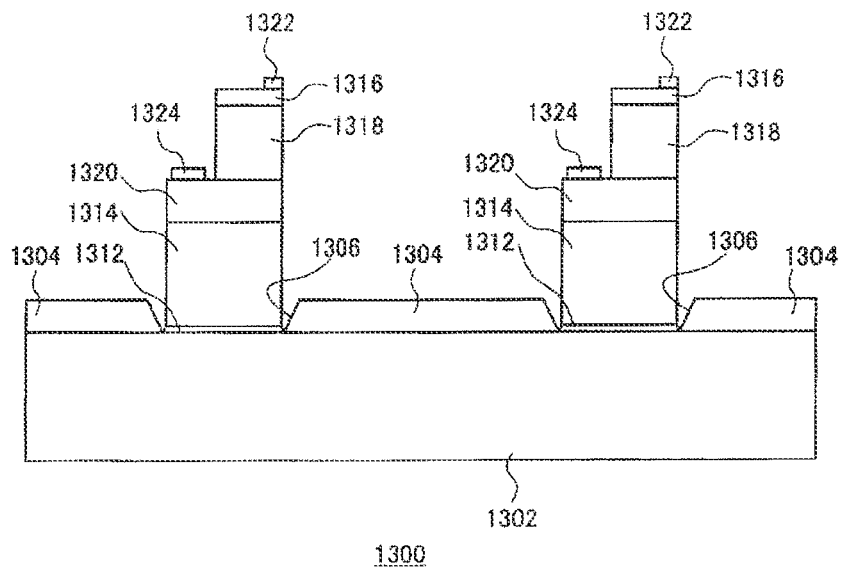
FIG. 13 shows an exemplary cross section of a sensor 1300.

Sensors 1300 shown in FIG. 13 were produced. As the base wafer 1302 containing silicon, a p-type Si wafer entirely made of silicon was prepared. On the surface of the base wafer 1302, a silicon oxide layer was formed as the inhibitor 1304 by a thermal oxidation method. The average thickness of the silicon oxide layer was 0.1 µm. Then, a plurality of apertures 1306 which expose the base wafer 1302 were formed in part of the inhibitor 1304 by photolithography. The size of an aperture 1306 was set to be 20 µm×20 µm.

The base wafer 1302 was formed inside the reaction chamber, and a Ge crystal layer was formed as the first seed member 1312. The Ge crystal layer was selectively grown inside the apertures 1306 by CVD. The Ge crystal layer was deposited to have a thickness of 1 µm, under a condition of using germane as a source gas, the pressure in the reaction chamber of 2.6 kPa, and the temperature of 600 degrees centigrade.

Subsequently, the Ge crystal layer was annealed in the reaction chamber. The annealing was conducted by repeating 10 times the series of annealing of under the temperature of 800 degrees centigrade for 10 minutes and under the temperature of 680 degrees centigrade for 10 minutes. The 10 times of the series of annealing was conducted without taking out the Ge crystal layer from the reaction chamber 1302 after formation.

After annealing the Ge crystal layer, a GaAs crystal layer was formed as the second seed member 1314 by MOCVD. The GaAs crystal layer was grown using trimethylgallium (TMG) and arsine as a source gas. The GaAs crystal layer was deposited by first growing a GaAs crystal under a growth temperature of 550 degrees centigrade, and then setting the GaAs crystal under a condition of the growth temperature of 650 degrees centigrade and the pressure in the reaction chamber of 8.0 kPa. The GaAs crystal layer was grown inside each aperture 1306, using the surface of the Ga crystal layer as a seed plane.

As a result of examination of the surfaces of thus obtained Ge crystal layer and GaAs crystal layer by the etch-pit method, no defect was observed on any of the surfaces. Moreover, a transmission electron microscope was used to observe the cross section of these crystal layers. The result shows no dislocation penetrating these crystal layers.

On thus obtained GaAs crystal layer, a GaAs crystal layer and an InGaP crystal layer as the cathode layer 1320, a GaAs crystal layer as the drift layer 1318, a GaAs crystal layer as the anode layer 1316 were formed in this order from the base wafer 1302 side, by MOCVD. The anode layer 1316, the drift layer 1318, and the cathode layer 1320 correspond to the photothermal absorber 120. The GaAs crystal layer was formed using trimethylgallium and arsine as a source gas. The InGaP crystal layer was formed using trimethylgallium, trimethylindium, and phosphine as a source gas. A semiconductor wafer was produced in the above-stated manner.

Subsequently, photolithography processing was performed, to produce a sensor 1300 using the anode layer 1316, the drift layer 1318, and the cathode layer 1320. The anode layer 1316 and the drift layer 1318 were etched to form a mesa structure, and an anode electrode 1322 was formed on the anode layer 3316. Then a cathode electrode 3324 was formed on the cathode layer 1320.

Figure 14:
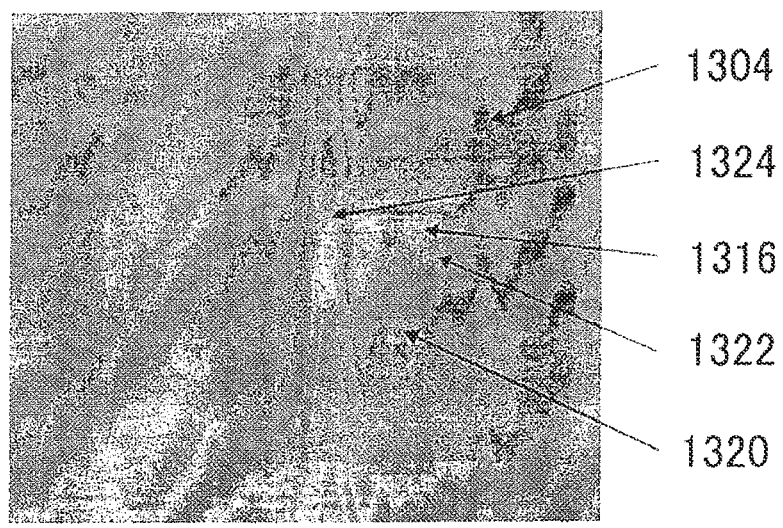
FIG. 14 is a laser microscopic image taken by observing the sensor 1300 from its front plane.
Figure 15:
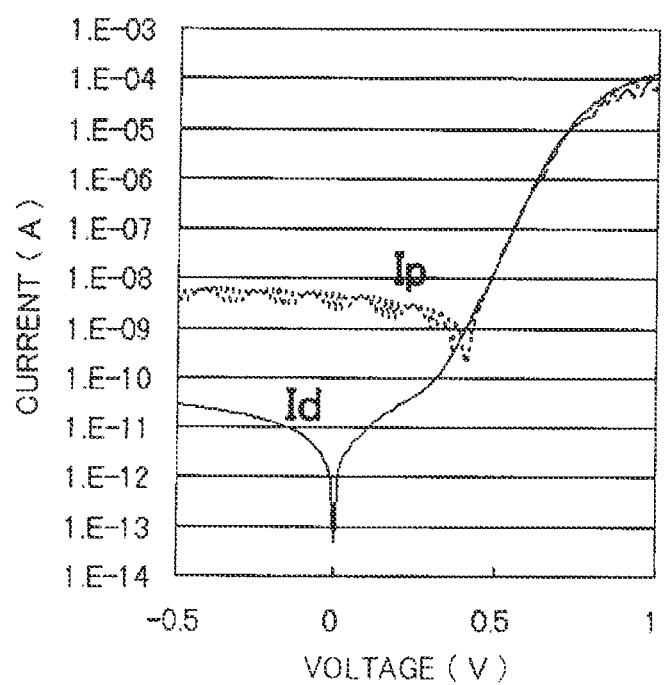
FIG. 15 shows the photocurrent vs. voltage characteristic and the dark current-voltage characteristic of the sensor 1300.

FIG. 14 is a laser microscopic image taken by observing the sensor 1300 from its front plane. FIG. 15 shows the result of measuring the current-voltage characteristic between the anode electrode 1322 and the cathode electrode 1324, for the photocurrent Ip and the dark current Ip. In FIG. 15, the solid line represents the dark current Id, and the broken line represents the photocurrent Ip. FIG. 15 shows two or more digits of optical sensitivity at the reverse bias voltage, and the normal diode characteristics have been observed in both of the dark current Id and the photocurrent Ip. This confirms normal operation of the sensor 1300.

The current-voltage characteristics of the dark current Id shows that the ideal factor (n-value) used to determine whether the device quality is good or bad was 1.18. Since the n-value is close to 1 which is the ideal value, the light absorber having a high crystallinity is confirmed to have been obtained. Also from the current-voltage characteristics of the photocurrent Ip, it is confirmed that the product has an optical sensitivity from the reverse bias to the forward bias and can operate as a highly sensitive sensor. Note that the ideal factor (n-value) is a value of "n" obtained by substituting the current-voltage characteristics of the pn-junction diode in the region not broken down, into the expression of $J=J_0(\exp(qV/nkT)-1)$, where J represents current, V represents voltage, $J_0$ represents reverse saturation current, q represents elementary charge, k represents Boltzmann constant, and T represents temperature, which can be obtained as a result of an experiment.

Figure 16:
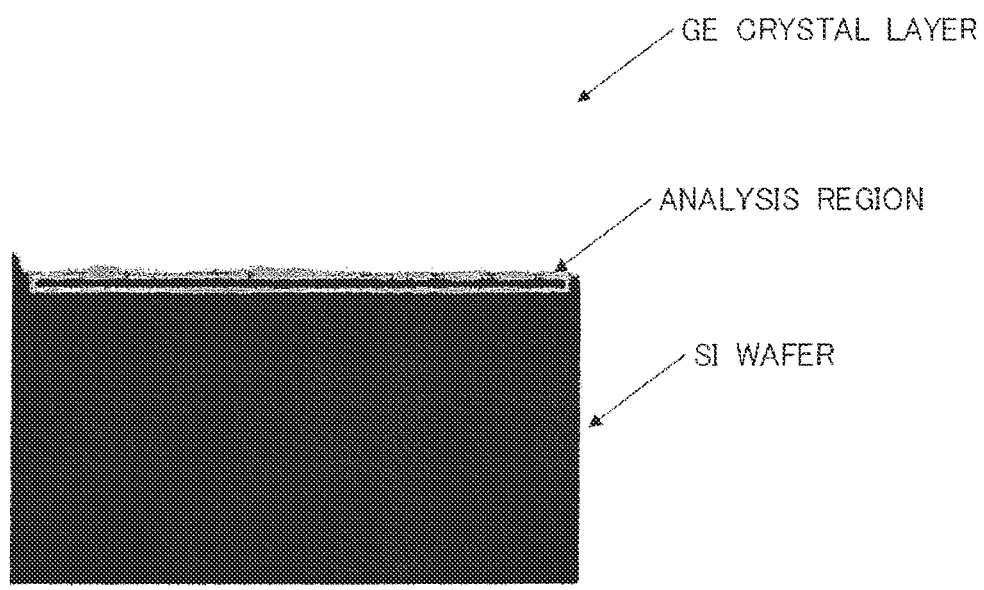
FIG. 16 shows a cross sectional SEM photograph in the vicinity of the interface between a Si wafer and a Ge crystal layer.
Figure 17:
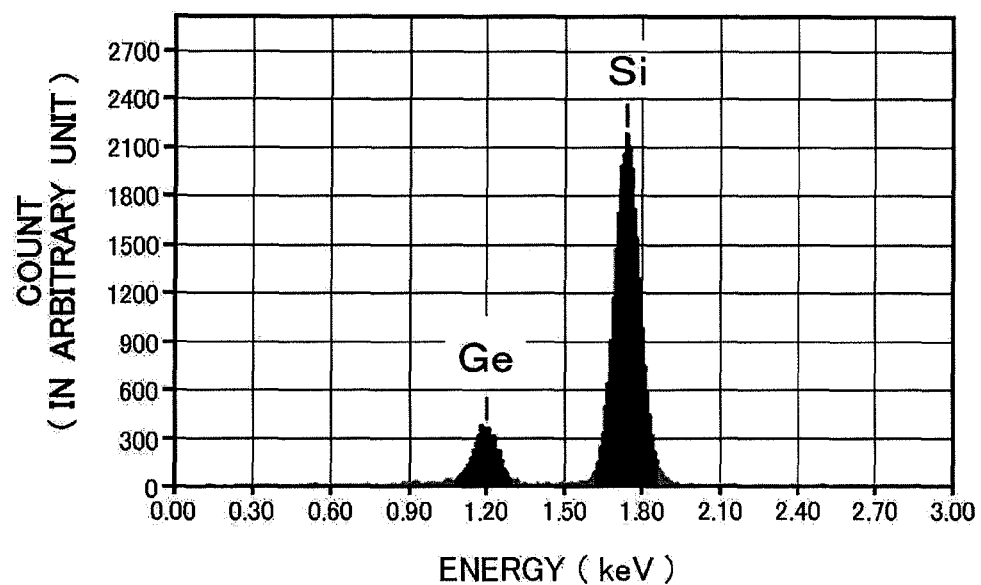
FIG. 17 shows a result of the energy diverse X-ray fluorescence analysis of the analysis region of FIG. 16.

FIG. 16 shows a cross sectional SEM photograph in the vicinity of the interface between a Si wafer and a Ge crystal layer. FIG. 17 shows a result of the energy diverse X-ray fluorescence analysis of the analysis region of FIG. 16. It is understood front FIG. 17 that despite the fact that the analysis region is situated nearer the Si wafer than to the interface between the Si wafer and the Ge crystal layer, the signal of the Ge element has been detected with intensity. The result shows that the Ge atoms have been diffused in the Si wafer, and the interface region which is SiGe is included inside the base wafer 1302 in contact with the interface between the Si wafer which is the base wafer 1302 and the Ge crystal layer which is the first seed member 1312.

Embodiment Example No. 2

Except that the apertures 1306 are sized, to 30 µm×30 µm, a silicon oxide layer was formed as the inhibitor 1304 on a p-type Si wafer that is the base wafer 1302, and a plurality of apertures 1306 which expose the base wafer 1302 were formed in part of the inhibitor 1304, just as in Embodiment Example No. 1. Subsequently, just as in Embodiment Example No. 1, a Ge crystal layer was formed as the first seed member 1312, the Ge crystal layer was annealed, and then a GaAs crystal layer was formed as the second seed member 1314.

In Embodiment Example No. 2, an InGaP crystal layer was formed as a light absorber, on the GaAs crystal layer which is the second seed member 1314. The electron state in the vicinity of the band gap of this InGaP crystal layer was analyzed using the cathode-luminescence (also referred to as "CL") spectroscopy.

Figure 18:
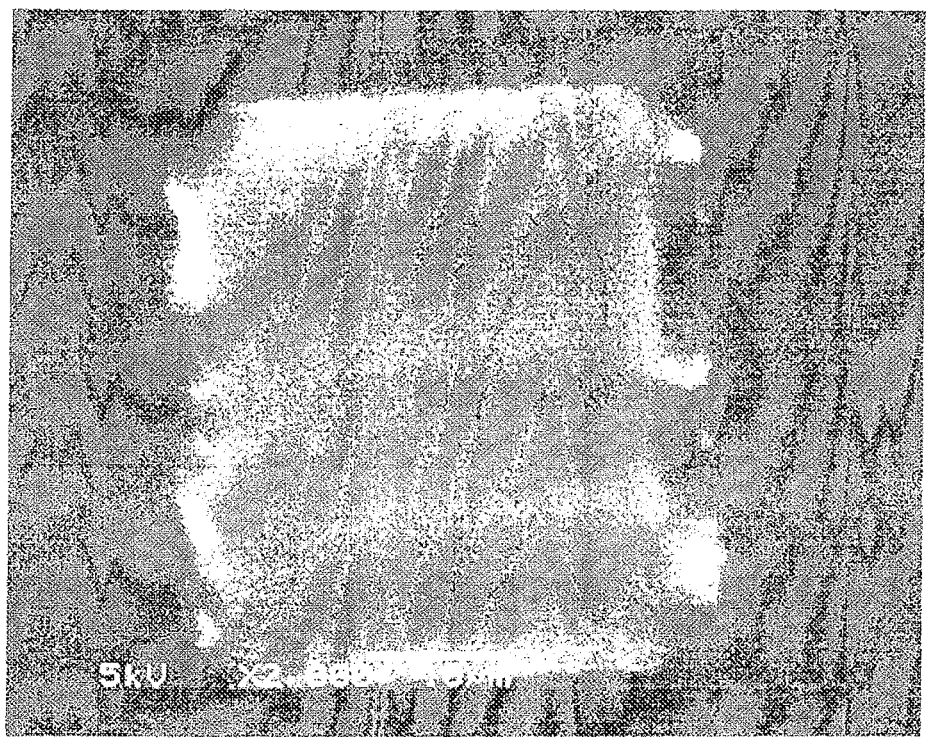
FIG. 18 shows a 650 nm light-emission image of a room-temperature cathode-luminescence spectroscopy of an InGaP crystal.
Figure 19:
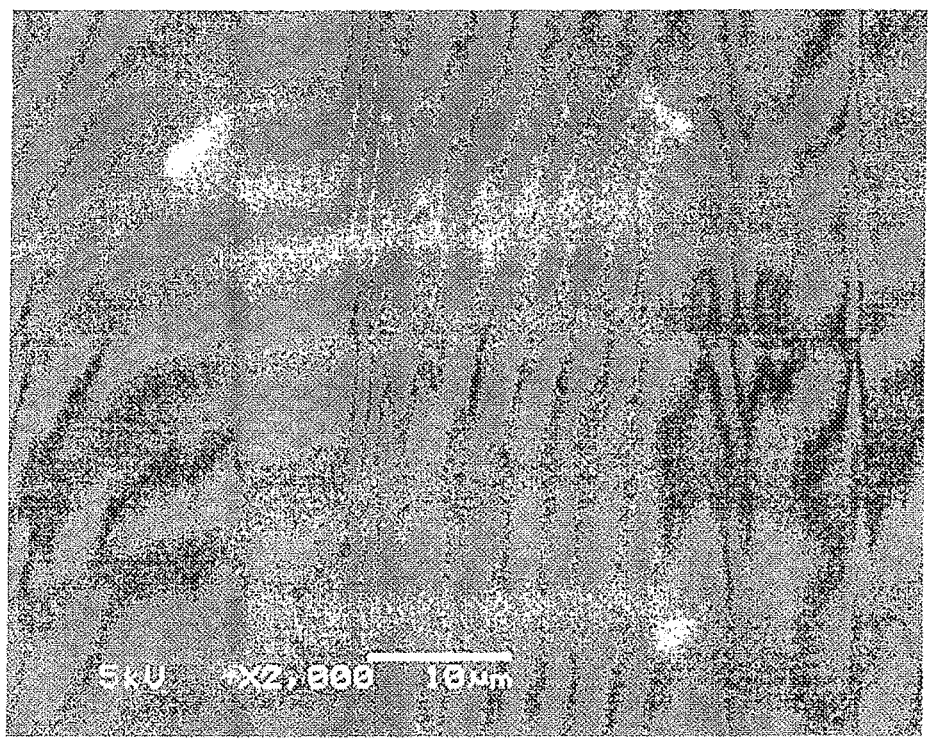
FIG. 19 shows a 700 nm light-emission image of a room-temperature cathode-luminescence spectroscopy of an InGaP crystal.

FIG. 18 shows a 650 nm light-emission image of a room-temperature cathode-luminescence spectroscopy of an InGaP crystal. FIG. 19 shows a 700 nm light-emission image of a room-temperature cathode-luminescence spectroscopy of an InGaP crystal. The 650 nm light-emission image in FIG. 18 is a light-emission image corresponding to the transition energy of 1.91 electron volt (represented as "eV"), and the 700 nm light-emission image in FIG. 19 is a light-emission image corresponding to the transition energy of 1.77 eV.

FIG. 18 and FIG. 19 show that, compared to the light-emission intensity at the central portion, the light-emission intensity of the periphery is lower in the 700 light-emission image and higher in the 650 nm light-emission image. Also the spectral analysis in the room-temperature cathode-luminescence spectroscopy of an InGaP crystal reveals that the band gap at the central portion of the InGaP crystal layer was about 1.82 eV which corresponds to the transition energy in 680 nm light emission.

These results are attributed to the fact the InGaP crystal layer has such a band structure as shown in FIG. 8 (i.e., the band structure having a wider band gap in the periphery than in the central portion). The reason for highly-sensitive operation of the sensor 1300 as shown in Embodiment Example No. 1 is attributed to the fact that the periphery has a wider band gap than the central portion, to restrain recombination of the carriers (electron-hole pair) generated by the photoelectron conversion, in the periphery.

Embodiment Example No. 3

Just as in Embodiment Example No. 1, on a p-type Si-wafer which is the base wafer 1302, a silicon oxide layer was formed as the inhibitor 1304, and a plurality of apertures 1306 which expose the base wafer 1302 were formed in part of the inhibitor 1304. Subsequently, just as in Embodiment Example No. 1, a Ge crystal layer was formed as the first seed member 1312, the Ge crystal layer was annealed, and then a GaAs crystal layer was formed as the second seed member 1314.

In Embodiment Example No. 3, on the GaAs crystal layer which is the second seed member 1314, an anode layer, a drift layer, and a cathode layer were formed in this order from the base wafer 1302 side. A GaAs crystal layer and an InGaP crystal layer were formed as the anode layer, a GaAs crystal layer was formed as the drift layer, and a GaAs crystal layer was formed as the cathode, layer. Each of these layers was formed by MOCVD. The anode layer, the drift layer, and the cathode layer correspond to a light absorber.

The anode layer, the drift layer, and the cathode layer were processed by photolithography to form a mesa structure, and an anode electrode in contact with the anode layer, and a cathode electrode in contact with the cathode layer were formed. In this way, an optical sensor using the anode layer, the drift layer, and the cathode layer was produced. The current-voltage characteristics between the cathode electrode and the anode electrode were measured, thereby conducting an operational test of the optical sensor. The optical sensor was confirmed to operate normally.

Embodiment Example No. 4

Just as in Embodiment Example No. 3, on a p-type Si wafer which is the base wafer 1302, a silicon oxide layer was formed as the inhibitor 1304, and a plurality of apertures 1306 which expose the base wafer 1302 were formed in part of the inhibitor 1304. Subsequently, just as in Embodiment Example No. 1, the base wafer 1302 was positioned inside the reaction chamber, to form a Ge crystal layer as the seed member. Then the Ge crystal layer was annealed in the reaction chamber.

After annealing the Ge crystal layer, an anode layer, a drift layer and a cathode layer were formed in this order from the base wafer 1302 side, in Embodiment Example No. 4. An InGaAs crystal layer was formed as the anode layer, an InGaAs crystal layer was formed as the drift layer, and an InGaAs crystal layer was formed as the cathode layer. Each of these layers was formed by MOCVD. The anode layer, the drift layer, and the cathode layer correspond to a light absorber. In forming the InGaAs crystal layer, trimethylgallium, trimethylindium, and arsine were used as source gas. The InGaAs crystal layer was grown inside the apertures 1306, using the surface of the Ge crystal layer as a seed plane. A contact layer made of a GaAs crystal layer was formed on the cathode layer made of an InGaAs crystal layer, by means of MOCVD.

On the GaAs crystal layer which is the contact layer, a $SiO_2$ layer (insulation film) was formed as a passivation layer. A semiconductor wafer was produced in the above-described manner. The passivation layer, the contact layer, the anode layer, the drift layer, and the cathode layer were processed by photolithography to form a mesa structure, and an anode electrode in contact with the anode layer, and a cathode electrode in contact with the cathode layer were formed. In this way, an optical sensor using the anode layer, the drift layer, and the cathode layer was produced. The current-voltage characteristics between the cathode electrode and the anode electrode were measured, thereby conducting an operational test of the optical sensor. The optical sensor was confirmed to operate normally.

Embodiment Example No. 5

Figure 20:
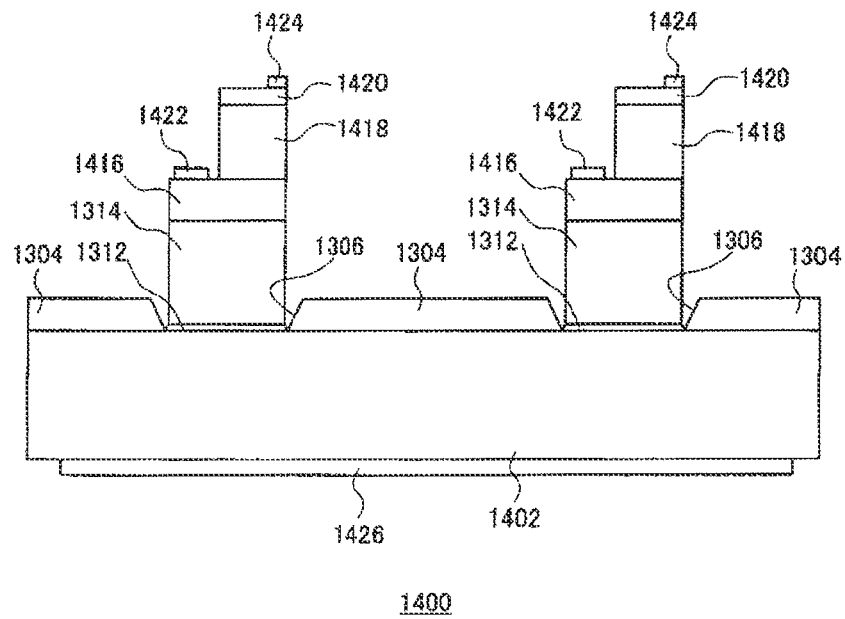
FIG. 20 schematically shows an exemplary cross section of a sensor 1400.
Figure 21:
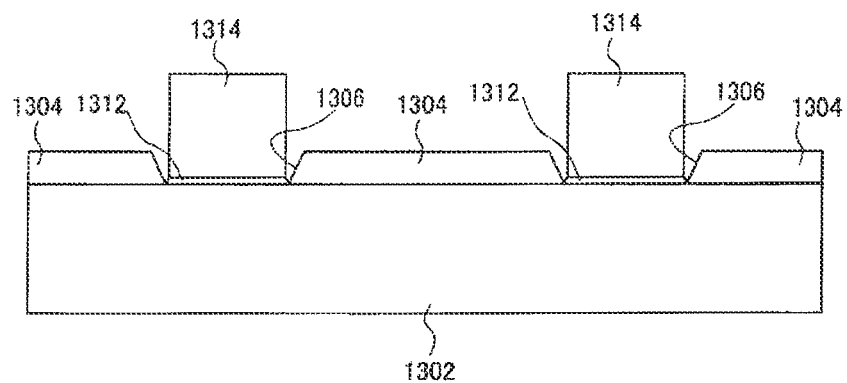
FIG. 21 shows an exemplary cross section of a sensor 1500 in its production process.

FIG. 20 schematically shows an exemplary cross section of a sensor 1400. As a base wafer 1402 containing silicon, a Si wafer entirely made of low-resistance silicon crystals was prepared. Just as in Embodiment Example No. 1, on the Si wafer, a silicon oxide layer was formed as the inhibitor 1304, and a plurality of apertures 1306 which expose the base wafer 1402 were formed in part of the inhibitor 1304. Subsequently, just, as in Embodiment Example No. 1, a Ge crystal layer was formed as the first seed member 1312, the Ge crystal layer was annealed, and then a GaAs crystal layer was formed as the second seed member 1314.

In Embodiment Example No. 5, on the GaAs crystal layer which is the second seed member 1314, an anode layer 1416, a drift layer 1418, and a cathode layer 1420 were formed in this order from the base wafer 1402 side. A GaAs crystal layer and an InGaP crystal layer were formed as the anode layer 1416, a GaAs crystal layer was formed as the drift layer 1418, and a GaAs crystal layer was formed as the cathode layer 1420. Each of these layers was formed by MOCVD. The anode layer 1416, the drift layer 1418, and the cathode layer 1420 correspond to a light absorber.

The anode layer 1416, the drift layer 1418, and the cathode layer 1420 were processed by photolithography to form a mesa structure, and an anode electrode 1422 in contact with the anode layer 1416, and a cathode electrode 1424 in contact with the cathode layer 1420 were formed. In this way, an optical sensor using the anode layer 1416, the drift layer 1418, and the cathode layer 3420 was produced. The current-voltage characteristics between the cathode electrode 1424 and the anode electrode 1422 were measured, thereby conducting an operational test of the optical sensor. The optical sensor was confirmed to operate normally.

In addition, a rear-surface anode electrode 1426 was formed on the rear surface of the base wafer 1402, to measure the current-voltage characteristics between the cathode electrode 1424 and the rear-surface anode electrode 3426, thereby conducting an operational test of the optical sensor. The optical sensor was confirmed to operate normally. This result confirms electrical coupling between the light absorber and the low-resistance silicon crystals.

Embodiment Example No. 6

Just as in Embodiment Example No. 1, on a p-type Si wafer which is the base wafer 1302, a silicon oxide layer was formed as the inhibitor 1304, and a plurality of apertures 1306 which expose the base wafer 1302 were formed in part of the inhibitor 1304. Subsequently, just as in Embodiment Example No. 1, a Ge crystal layer was formed as the first seed member 1312, the Ge crystal layer was annealed, and then a GaAs crystal layer was formed as the second seed member 1314.

In Embodiment Example No. 6, on the GaAs crystal layer which is the second seed member 1334, a cathode layer, a drift layer, and an anode layer were formed in this order from the base wafer 3302 side. The cathode layer was formed by a GaAs crystal layer and an InGaP crystal layer, the drift layer was formed to be a superlattice structure made by repeatedly stacking, ten times, InGaP crystal layer whose thickness is 20 nm and GaAs crystal layer whose thickness is 40 nm, and the anode layer was formed by a GaAs crystal layer. Each of these layers was formed by MOCVD. The cathode layer, the drift layer, and the anode layer correspond to a light absorber.

The cathode layer, the drift layer, and the anode layer were processed by photolithography to form a mesa structure, and an anode electrode in contact with the anode layer, and a cathode electrode in contact with the cathode layer were formed. In this way, an optical sensor using the cathode layer, the drift layer, and the anode layer was produced. The current-voltage characteristics between the cathode electrode and the anode electrode were measured, thereby conducting an operational test of the optical sensor. The optical sensor was confirmed to operate normally.

Embodiment Example No. 7

FIG. 21 through FIG. 24 respectively show an exemplary cross section of a sensor 1500 in its production process. FIG. 25 schematically shows an exemplary cross section of the sensor 1500. Just as in Embodiment Example No. 1, on a p-type Si wafer which is the base wafer 1302, a silicon oxide layer was formed as the inhibitor 1304, and a plurality of apertures 1306 which expose the base wafer 1302 were formed in part of the inhibitor 1304 (see FIG. 21). Subsequently, just as in Embodiment Example No. 1, a Ge crystal layer was formed as the first, seed member 1312, the Ge crystal layer was annealed, and then a GaAs crystal layer was formed as the second seed member 1314.

Figure 22:
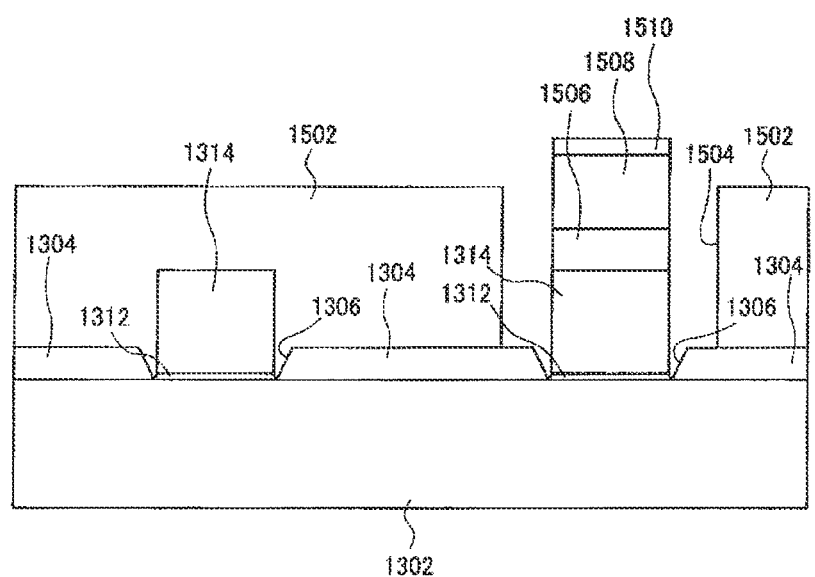
FIG. 22 shows an exemplary cross section of the sensor 1500 in its production process.

Next, as shown in FIG. 22, a silicon oxide layer 1502 was formed to cover the second seed member 1314, and an aperture 1504 was formed in the region in which a light absorber is to be formed later. On the GaAs crystal layer which is the second seed member 1314 exposed inside the aperture 1504, the cathode layer 1506, the drift layer 1508, and the anode layer 1510 were formed in this order from the base wafer 1302 side. A GaAs crystal layer and an InGaP crystal layer were formed as the cathode layer 1506, a GaAs crystal layer was formed as the drift layer 1508, and a GaAs crystal layer was formed as the anode layer 1510. Each of these layers was formed by MOCVD. The cathode layer 1506, the drift layer 1508, and the anode layer 1510 correspond to a light absorber.

Figure 23:
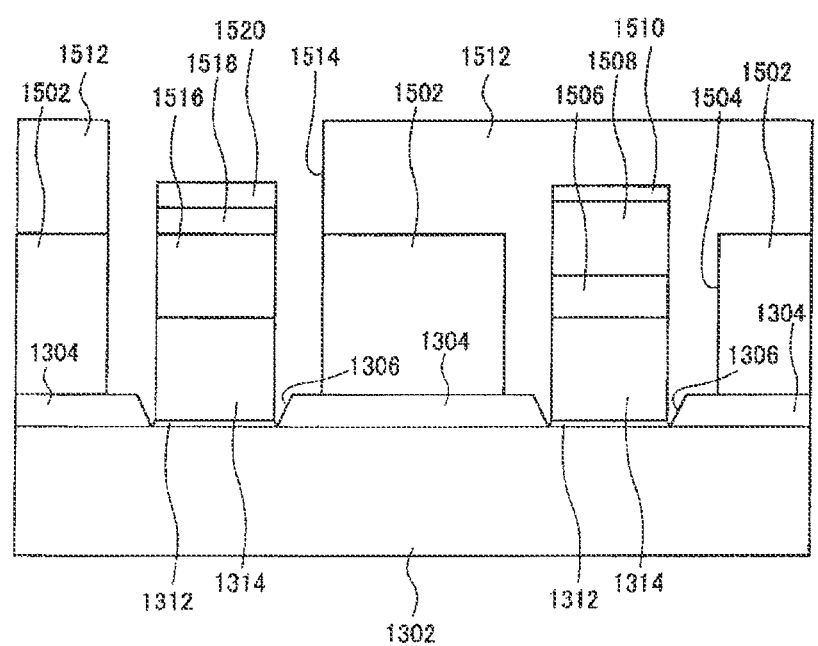
FIG. 23 shows an exemplary cross section of the sensor 1500 in its production process.

Next, as shown in FIG. 23, a silicon oxide layer 1512 was formed to cover the anode layer 1510, and an aperture 1514 was formed in the region in which an amplifying element is to be formed later. On the GaAs crystal layer which is the second seed member 1314 exposed inside the aperture 1514, a GaAs crystal layer as the collector layer 1516, an InGaP crystal layer as the base layer 1518, and an InGaAs crystal layer as the emitter layer 1520 were formed by epitaxial growth using MOCVD. The epitaxial layer structure made of the collector layer 1516, the base layer 1518, and the emitter layer 1520 becomes a heterojunction bipolar transistor, which is an amplifying element.

Figure 24:
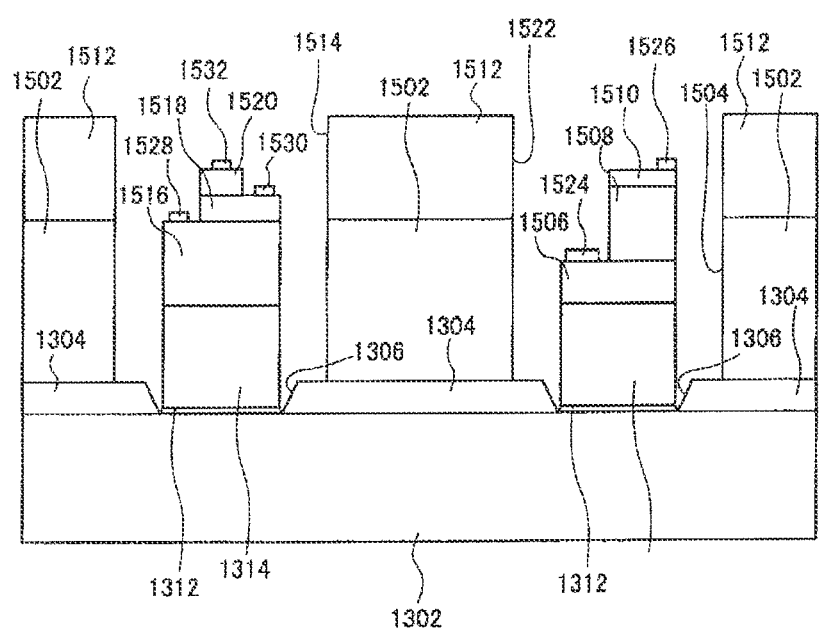
FIG. 24 shows an exemplary cross section of the sensor 1500 in its production process.
Figure 25:
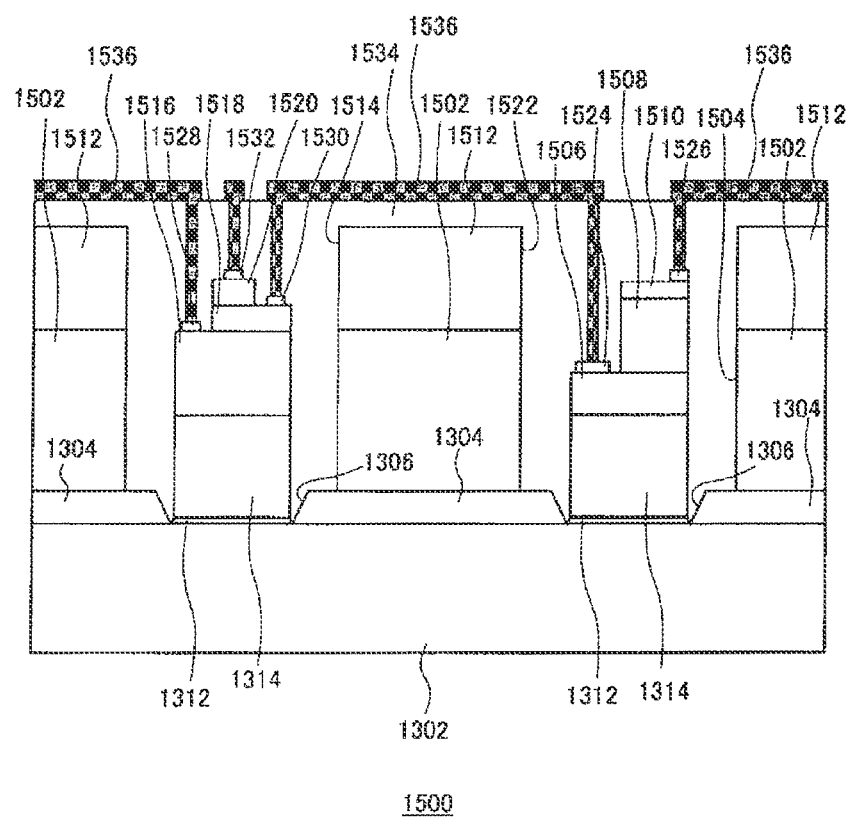
FIG. 25 schematically shows an exemplary cross section of the sensor 1500.

Next, as shown in FIG. 24, the silicon oxide layer 1512 situated on the anode layer 1510 was removed to form an aperture 1522, and the cathode layer 1506, the drift layer 1508, and the anode layer 1510 were processed by photolithography to form a mesa structure. Then, a cathode electrode 1524 in contact with the cathode layer 1506, and an anode electrode 1526 in contact with the anode layer 1510 were formed. In this way, an optical sensor using the cathode layer 1506, the drift layer 1508, and the anode layer 1510 was produced. The current-voltage characteristics between the cathode electrode 1524 and the anode electrode 1526 were measured, thereby conducting an operational test of the optical sensor. The optical sensor was confirmed to operate normally.

Furthermore, the collector layer 1516, the base layer 1518, and the emitter layer 1520 were processed by photolithography to form a mesa structure. Then, a collector electrode 1528 in contact with the collector layer 1516, a base electrode 1530 in contact with the base layer 1518, and an emitter electrode 1532 in contact with the emitter layer 1520 were formed, thereby producing an amplifying element.

Finally as shown in FIG. 25, an insulation layer 1534 to cover the optical sensor element and the amplifying element was formed, and the insulation film 1534 was etched to form a via hole. A wire 1536 connecting the cathode electrode 1524, the anode electrode 1526, the collector electrode 1528, the base electrode 1530, and the emitter electrode 1532 each other via the via hole was formed. A sensor 1500 was produced in the above-described manner.

An example of the insulation layer 1534 is polyimide film. Some examples of the wire 1536 include such metal film as aluminum, gold, a two-layer structure of titanium and gold, and a three-layer structure of titanium, white gold, and gold. The wire 1536 was formed on the inhibitor 1304, to connect the optical sensor element and the amplifying element formed to sandwich the inhibitor 1304. The electrical characteristics of the collector electrode 1528, the base electrode 1530, and the emitter electrode 1532 were measured, thereby conducting an operational test of the heterojunction bipolar transistor, which is an amplifying element. The heterojunction bipolar transistor was confirmed to operate normally.

Note that if the wire 1536 can be formed, the insulation layer 1534 is not indispensable. In addition, a wire may be formed between the inhibitor 1304 and the silicon oxide layer 1502, or between the silicon oxide layer 1502 and the silicon oxide layer 1512, to use the wire to interconnect with the wire 1536.

The invention claimed is:

1. A sensor comprising:
   a base wafer containing silicon;
   a seed member provided directly or indirectly on the base wafer:
   a photothermal absorber that is made of a Group 3-5 compound semiconductor lattice-matching or pseudo lattice-matching the seed member and being capable of generating a carrier upon absorbing light or heat; and
   a recombination repressor that is formed in contact with a side wall of the photothermal absorber and represses recombination of a currier generated by the Group 3-5 compound semiconductor on the side wall, the recombination repressor having a semiconductor or a dielectric having a larger band gap than the band gap of the photothermal absorber; wherein
   the photothermal absorber outputs an electric signal in response to incident light to be introduced into the photothermal absorber or heal to be applied to the photothermal absorber,
   the photothermal absorber is a superlattice structure in which a first layer and a second layer are stacked together,
   the first layer is made of $Ga_{x1}In_{1-x1}N_{y1}P_{z1}As_{w1}Sb_{1-y1-z1-w1}$ ($0 \leq x1 \leq 1$, $0 \leq y1 \leq 1$, $0 \leq z1 \leq 1$, $0 \leq w1 \leq 1$, and $0 \leq y1+z1+w1 \leq 1$) and the second layer is made of $Ga_{x4}In_{1-x4}N_{y4}P_{z4}As_{w3}Sb_{1-y4-z4-w3}$ ($0 \leq x4 \leq 1$, $0 \leq y4 \leq 1$, $0 \leq z4 \leq 1$, $0 \leq w3 \leq 1$, and $0 \leq y4+z4+w3 \leq 1$) and has a band gap larger than the band gap of the first layer,
   the seed member is made of $C_{x2}Si_{y2}Ge_{z2}Sn_{1-x2-y2-z2}$ ($0 \leq x2 < 1$, $0 \leq y2 \leq 1$, $0 \leq z2 \leq 1$, and $0 < x2+y2+z2 \leq 1$), and
   the sensor further comprises an interface region formed inside the base wafer in contact with an interface between the base wafer and the seed member, the interface region having a composition $C_{x2}Si_{y2'}Ge_{z2}Sn_{1-x2-y2'-z2}$ ($0 < x2 \leq 1$, $0 < y2' \leq 1$, $0 \leq z2 \leq 1$, $0 < x2+y2+z2 \leq 1$, and $y2 < y2' < 1$).

2. The sensor as set forth in claim 1, further comprising:
   an inhibitor that is formed directly or indirectly on the base wafer, has an aperture in which at least a partial region of the base wafer is exposed, and inhibits crystal growth, wherein
   the seed member is formed in the aperture.

3. The sensor as set forth in claim 2, wherein
   the inhibitor includes a plurality of the apertures, and the sensor comprises a plurality of the photothermal absorbers formed inside the plurality of the apertures.

4. The sensor as set forth in claim 3, wherein
   the base wafer includes an impurity region containing an impurity,
   the seed member is disposed in contact with the impurity region, and
   at least two of the plurality of the photothermal absorbers are electrically coupled to the impurity region via the seed member.

5. The sensor as set forth in claim 1, further comprising:
   a light collecting section that collects at least part of the incident light and
   introduces it to the photothermal absorber.

6. The sensor as set forth in claim 5, further comprising:
   an optical filter arranged on a path along which the incident light is introduced to the photothermal absorber.

7. The sensor as set forth in claim 6, wherein
   the light collecting section is disposed on a side of the base wafer opposite to the side on which the photothermal absorber is disposed, and collects the incident light and introduces it to the photothermal absorber via the base wafer.

8. The sensor as set forth in claim 5, comprising:
   an inhibitor that is formed directly or indirectly on the base wafer, has a plurality of apertures in which at least a partial region of the base wafer is exposed, and inhibits crystal growth,
   a plurality of seed members provided in the plurality of the apertures; and
   a plurality of photothermal absorbers, each disposed on a corresponding one of the plurality of the seed members and lattice-matching or pseudo lattice-matching the corresponding seed member, wherein
   the light collecting section introduces at least part of the incident light on each of the plurality of the photothermal absorbers.

9. The sensor as set forth in claim 8, further comprising:
   a plurality of amplifying elements formed on the base wafer each in correspondence to the plurality of the photothermal absorbers; and
   a wire formed on the inhibitor to connect the plurality of the amplifying elements to the plurality of the photothermal absorbers.

10. The sensor as set forth in claim 1, wherein
    the photothermal absorber has a compositional distribution such that the band gap is larger at a position further distanced from the center of the plane parallel to the base wafer.

11. The sensor as set forth in claim 10, wherein
    the photothermal absorber has a compositional distribution such that the ratio of In is smaller at a position further distanced from the center when x1 is not 1.

12. The sensor as set forth in claim 1, wherein
    the base wafer includes an impurity region containing an impurity having a conductivity type opposite to the conductivity type of an impurity contained in a bulk region of the silicon, and
    the photothermal absorber is electrically coupled to the impurity region via the seed member.

13. The sensor as set forth in claim 1, wherein
    the seed member generates an electric signal in response to the incident light.

14. A semiconductor wafer comprising;
    a base wafer containing silicon;
    a seed member provided directly or indirectly on the base wafer;
    a photothermal absorber that is made of a Group 3-5 compound semiconductor lattice-matching or pseudo lattice-matching the seed member and being capable of generating carrier upon absorbing light or heat; and
    a recombination repressor that is formed in contact with a side wall of the photothermal absorber and represses recombination of a carrier generated by the Group 3-5 compound semiconductor on the side wall, the recombination repressor having a semiconductor or a dielectric having a larger band gap than the band gap of the photothermal absorber, wherein the photothermal absorber is a superlattice structure in which a first layer and a second layer are stacked together,
    the first layer is made of $Ga_{x1}In_{1-x1}N_{y1}P_{z1}As_{w1}Sb_{1-y1-z1-w1}$ ($0 \leq x1 \leq 1$, $0 \leq y1 \leq 1$, $0 \leq z1 \leq 1$, $0 \leq w1 \leq 1$, and $0 \leq y1+z1+w1 \leq 1$) and the second layer is made of $Ga_{x4}In_{1-x4}N_{y4}P_{z4}As_{w3}Sb_{1-y4-z4}-w_3$ ($0 \leq x4 \leq 1$, $0 \leq y4 \leq 1$, $0 \leq z4 \leq 1$, $0 \le w3 \le 1$, and $0 \le y4+z4+w3 \le 1$) and has a band gap larger than the band gap of the first layer, the seed member is made of $C_{x2}Si_{y2}Ge_{z2}Sn_{1-x2-y2-z2}$ ($0 \le x2 < 1$, $0 \le y2 \le 1$, $0 \le z2 \le 1$, and $0 < x2+y2+z2 \le 1$), and the sensor further comprises an interface region formed inside the base wafer in contact with an interface between the base wafer and the seed member, the interface region having a composition $C_{x2}Si_{y2'}Ge_{z2}Sn_{1-x2-y2'-z2}$ ($0 < x2 \le 1$, $0 < y2' \le 1$, $0 \le z2 \le 1$, $0 < x2+y2+z2 \le 1$, and $y2 < y2' < 1$).

15. The semiconductor wafer as set forth in claim 14 further comprising:

an inhibitor that is formed directly or indirectly on the base wafer, has an aperture in which at least a partial region of the base wafer is exposed, and inhibits crystal growth, wherein the seed member is formed in the aperture.

16. The semiconductor wafer as set forth in claim 15, wherein the inhibitor includes a plurality of the apertures, and the semiconductor wafer comprises a plurality of the photothermal absorbers formed inside the plurality of the apertures.

17. The semiconductor wafer as set forth in claim 16, wherein the base wafer includes an impurity region containing an impurity, the seed member is disposed in contact with the impurity region, and at least two of the plurality of the photothermal absorbers are electrically coupled to the impurity region via the seed member.

18. The semiconductor wafer as set forth in claim 14, wherein the photothermal absorber has a compositional distribution such that the band gap is larger at a position further distanced from the center of the plane parallel to the base wafer.

19. The semiconductor wafer as set forth in claim 18, wherein the photothermal absorber has a compositional distribution such that the ratio of In is smaller at a position further distanced from the center when x1 is not 1.

20. The semiconductor wafer as set forth in claim 14, wherein the base wafer includes an impurity region containing an impurity having a conductivity type opposite to the conductivity type of an impurity contained in a bulk region of the silicon, and the photothermal absorber is electrically coupled to the impurity region via the seed member.

* * * * *